United States Patent
Zhang et al.

(10) Patent No.: US 11,643,716 B2
(45) Date of Patent: May 9, 2023

(54) HIGH-REFRACTIVE-INDEX HYDROGENATED SILICON FILM AND METHODS FOR PREPARING THE SAME

(71) Applicant: ZHEJIANG CRYSTAL-OPTECH CO., LTD., Taizhou (CN)

(72) Inventors: Ruizhi Zhang, Taizhou (CN); Jian Tang, Taizhou (CN); Ying Wang, Taizhou (CN); Hui Yu, Taizhou (CN); Zhangwu Lu, Taizhou (CN); Zhengchi Xu, Taizhou (CN); Qibin Zhang, Taizhou (CN)

(73) Assignee: ZHEJIANG CRYSTAL-OPTECH CO., LTD., Taizhou (CN)

( * ) Notice: Subject to any disclaimer, the term of this patent is extended or adjusted under 35 U.S.C. 154(b) by 132 days.

(21) Appl. No.: 16/463,365

(22) PCT Filed: Jan. 5, 2018

(86) PCT No.: PCT/CN2018/071606
§ 371 (c)(1),
(2) Date: May 22, 2019

(87) PCT Pub. No.: WO2019/085265
PCT Pub. Date: May 9, 2019

(65) Prior Publication Data
US 2019/0352222 A1 Nov. 21, 2019

(30) Foreign Application Priority Data
Nov. 1, 2017 (CN) .......................... 201711061130.6

(51) Int. Cl.
*C23C 14/58* (2006.01)
*C23C 14/50* (2006.01)
(Continued)

(52) U.S. Cl.
CPC ........ *C23C 14/0078* (2013.01); *C03C 17/245* (2013.01); *C23C 14/0068* (2013.01);
(Continued)

(58) Field of Classification Search
CPC ..... C23C 14/0078; C23C 14/10; C23C 14/14; C23C 14/35; C23C 14/5826;
(Continued)

(56) References Cited

U.S. PATENT DOCUMENTS 4,964,962 A * 10/1990 Nobutani .............. C23C 14/022
204/192.15
6,239,044 B1 * 5/2001 Kashiwagi ................ C23C 8/16
438/787
(Continued)

FOREIGN PATENT DOCUMENTS

CN 101328574 A 12/2008
CN 101805891 A 8/2010
(Continued)

OTHER PUBLICATIONS

Microwave frequency. Wikipedia.org [https://en.wikipedia.org/wiki/Microwave] [Accessed on May 12, 2022].*
(Continued)

*Primary Examiner* — Michael A Band
(74) *Attorney, Agent, or Firm* — ArentFox Schiff LLP

(57) ABSTRACT

A preparation method for a high-refractive index hydrogenated silicon film, a high-refractive index hydrogenated silicon film, a light filtering lamination and a light filtering piece. The method includes: (a) by magnetic controlled Si target sputtering, Si deposits on a base body, forming a silicon film, which (b) forms an oxygenic hydrogenated silicon film in environment of active hydrogen and active oxygen, the amount of active oxygen accounts for 4%-99% of the total amount of active hydrogen and active oxygen, or, (Continued)

a nitric hydrogenated silicon film in environment of active hydrogen and active nitrogen, the amount of active nitrogen accounts for 5%-20% of the total amount of active hydrogen and active nitrogen. Sputtering and reactions are separately conducted, Si first deposits on the base body by magnetic controlled Si target sputtering, and then plasmas of active hydrogen and active oxygen/nitrogen react with silicon for oxygenic or nitric SiH.

6 Claims, 6 Drawing Sheets

(51) Int. Cl.
| | |
|---|---|
| C23C 14/35 | (2006.01) |
| C23C 14/14 | (2006.01) |
| C23C 14/10 | (2006.01) |
| C23C 14/02 | (2006.01) |
| C23C 14/00 | (2006.01) |
| C03C 17/245 | (2006.01) |

(52) U.S. Cl.
CPC ............ *C23C 14/022* (2013.01); *C23C 14/10* (2013.01); *C23C 14/35* (2013.01); *C23C 14/505* (2013.01); *C23C 14/5806* (2013.01); *C23C 14/5826* (2013.01); *C23C 14/5846* (2013.01); *C03C 2217/213* (2013.01); *C03C 2217/70* (2013.01); *C03C 2218/154* (2013.01); *C03C 2218/156* (2013.01)

(58) Field of Classification Search
CPC ............ C23C 14/5846; C23C 14/5853; C23C 14/5833; C23C 14/021; C23C 14/022; C23C 14/0068; C23C 14/505; C03C 2218/154; C03C 2218/156; C03C 17/245; C03C 2217/213; C03C 2217/28; C03C 2218/155; C03C 2218/32; C03C 17/3636
See application file for complete search history.

(56) References Cited

U.S. PATENT DOCUMENTS

| | | | | |
|---|---|---|---|---|
| 7,148,155 | B1* | 12/2006 | Tarafdar | ............ H01L 21/02164 438/778 |
| 9,422,620 | B2* | 8/2016 | Sugawara | ................ C23C 28/04 |
| 9,945,995 | B2 | 4/2018 | Hendrix et al. | |
| 2007/0123004 | A1 | 5/2007 | Takahashi et al. | |
| 2013/0292244 | A1* | 11/2013 | Ockenfuss | .......... C23C 14/3407 204/192.22 |
| 2016/0238759 | A1 | 8/2016 | Sprague et al. | |

FOREIGN PATENT DOCUMENTS

| | | |
|---|---|---|
| CN | 104471449 A | 3/2015 |
| CN | 107209306 A | 9/2017 |
| EP | 0582228 A1 | 2/1994 |
| JP | H0653137 A | 2/1994 |
| JP | 2005064328 A | 3/2005 |
| KR | 10-2017-0117533 A | 10/2017 |
| WO | 2014014930 A2 | 1/2014 |
| WO | 2016134122 A1 | 8/2016 |

OTHER PUBLICATIONS

Radio frequency. Wikipedia.org [https://en.wikipedia.org/wiki/Radio_frequency] [Accessed on May 12, 2022].*
International Search Report and Written Opinion for Corresponding International Application No. PCT/CN2018/071606, dated Jul. 27, 2018), 15 pages, ISA/CN.
International Search Report for Corresponding International Application No. PCT/CN2018/071606 (3 Pages) (dated Jul. 27, 2018).
Japanese Office Action for corresponding Japanese patent application No. 2019-523641, Japanese Patent Office, dated May 12, 2020, 8 pages.
Notice of Decision to Grant for corresponding Japanese patent application No. 2019-523641, Japanese Patent Office, dated Aug. 21, 2020, 5 pages.
Korean Office Action for corresponding Korean patent application No. 10-2019-7011936, Korean Patent Office, dated Sep. 9, 2020, 12 pages.
Notice of Grant for corresponding Korean patent application No. 10-2019-7011936, Korean Patent Office, dated Dec. 15, 2020, 8 pages.
First Office action for foreign priority CN 201711061130.6, Chinese Patent Office, dated Jul. 4, 2018, 14 pages.
Notice of Grant for foreign priority CN 201711061130.6, Chinese Patent Office, dated Sep. 12, 2018, 6 pages.
Notice of Allowance for corresponding Singaporen patent application No. 11201809352W dated Aug. 27, 2022, Singapore Patent Office.

* cited by examiner

Prior Art

HIGH-REFRACTIVE-INDEX HYDROGENATED SILICON FILM AND METHODS FOR PREPARING THE SAME

CROSS-REFERENCE TO RELATED APPLICATIONS

This application is a 371 U.S. National Phase Entry Application of PCT/CN2018/071606, filed Jan. 5, 2018, which claims the priority from Chinese Patent Application No. 201711061130.6 filed Nov. 1, 2017, the contents of each of which are incorporated herein by reference.

TECHNICAL FIELD

The present disclosure relates to the technical field of optical films, particularly to a preparation method for a high-refractive index hydrogenated silicon film, a high-refractive index hydrogenated silicon film, a filter stack, and a filter.

BACKGROUND ART

Hydrogenated silicon films attract much attention due to a broad application prospect in microelectronic devices such as infrared imaging sensors, solar cells, and film transistors. Preparation processes for hydrogenated silicon are mainly divided into chemical vapor deposition, such as plasma enhanced chemical vapor deposition; and physical deposition, such as radio-frequency sputtering.

In near infrared imaging systems such as 3D, narrow-band bandpass filters are used, requiring that even in cases of large-angle incidence, an angle-dependent offset of a central wavelength of light is still as small as possible, thus less signal loss and a high signal to noise ratio can be ensured within a relatively wide field of view. However, for fabricating such narrow-band bandpass filters, a film coating material with a superhigh refractive index and a material with a relatively low refractive index need to be stacked one above another and coated to be formed, and a film structure usually includes dozens to even hundreds of layers, with a total thickness of more than 8 µm.

In the prior art, in a Chinese patent filed by JDS UNIPHASE CORP. in 2013, with the publication number CN104471449 A, a hydrogenated silicon with a high refractive index and a low extinction coefficient is mentioned, and results show that each hydrogenated silicon layer has a refractive index of greater than 3 over a wavelength range of 800 nm to 1100 nm and an extinction coefficient of less than 0.0005 over the wavelength range of 800 nm to 1100 nm. Such high-refractive-index hydrogenated silicon layer is realized by a patented film coating device (a sputter-deposition system) of this company, and a structure of the sputter-deposition system is as shown in FIG. 1. The sputter-deposition system activates introduced hydrogen through a plasma activation source (PAS) 460, to overlap with a sputtered silicon material (a silicon target) 431, such that the hydrogenated silicon layer is deposited onto a substrate 420 at a relatively high deposition rate with a relatively low hydrogen content. This technology belongs to reactive sputtering, that is, when a target material (a silicon target) is sputtered in an environment of a reactive gas, the target material reacts with the gas to form a compound—hydrogenated silicon. However, this technology uses the reactive sputtering principle, a situation of "poisoning" of the target material may occur, that is, the target material is likely to be polluted by hydrogen, causing problems such as unstable production.

Filters with low offset effect are desired, it is hard to prepare hydrogenated silicon with a high refractive index of 2.5 or above and a extinction coefficient of below 0.0005 through common sputtering devices, while dedicated complex film coating devices have to be used. However, film coating machines manufactured in the prior art have relatively low production efficiency, thus the cost of a single filter is always high.

In view of this, the present disclosure is specifically proposed.

SUMMARY

A first one of the objects of the present disclosure is to provide a preparation method for a high-refractive index hydrogenated silicon film, with which method, the production efficiency is improved, the cost is reduced, and an obtained oxygen-containing or nitrogen-containing hydrogenated silicon film has a relatively high refractive index and lower absorption.

A second one of the objects of the present disclosure is to provide a high-refractive index hydrogenated silicon film obtained using the preparation method for a high-refractive index hydrogenated silicon film, which film has a high refractive index and low absorption.

A third one of the objects of the present disclosure is to provide a filter stack, prepared by taking the oxygen-containing or nitrogen-containing hydrogenated silicon film as a high-refractive-index material, which has advantages of a high transmittance, a relatively small offset of a center wavelength, less signal loss, and a high signal to noise ratio.

A fourth one of the objects of the present disclosure is to provide a filter including the filter stack, which filter has the same advantages as the above filter stack, such that the prepared filter has a relatively high transmittance and a small offset of a center wavelength.

In order to achieve the above objects of the present disclosure, following technical solutions are specifically used:

According to a first aspect, a preparation method for a high-refractive index hydrogenated silicon film is provided, including following steps:

(a) by means of magnetron Si target sputtering, depositing Si on a base body to form a silicon film;

(b) the silicon film forming an oxygen-containing hydrogenated silicon film in an environment containing active hydrogen and active oxygen, an amount of the active oxygen accounting for 4~99% of a total amount of the active hydrogen and the active oxygen, or, the silicon film forming a nitrogen-containing hydrogenated silicon film in an environment containing active hydrogen and active nitrogen, an amount of the active nitrogen accounting for 5~20% of a total amount of the active hydrogen and the active nitrogen.

Preferably, on the basis of the technical solution of the present disclosure, in Step (b), the amount of the active oxygen accounts for 4~70% of the total amount of the active hydrogen and the active oxygen, or, the amount of the active nitrogen accounts for 5~18% of the total amount of the active hydrogen and the active nitrogen.

Preferably, in Step (b), the amount of the active oxygen accounts for 5~20% of the total amount of the active hydrogen and the active oxygen, or, the amount of the active nitrogen accounts for 5~10% of the total amount of the active hydrogen and the active nitrogen.

Preferably, on the basis of the technical solution of the present disclosure, the preparation method for a high-refractive-index hydrogenated silicon film includes following steps:

(a) in the presence of an inert gas, by means of MF magnetron Si target sputtering, depositing Si on a base body to form a silicon film;

(b) in the presence of a mixed gas of hydrogen, oxygen, and an inert gas, activating the mixed gas through RF or ICP, to form plasmas which react with the silicon film, forming the oxygen-containing hydrogenated silicon film, wherein the oxygen accounts for, in percentage by volume, 4~99%, preferably 4~70%, and further preferably 5~20%, of the hydrogen-oxygen mixed gas, or, in the presence of a mixed gas of hydrogen, nitrogen, and an inert gas, activating the mixed gas through RF or ICP, to form plasmas which react with the silicon film, forming the nitrogen-containing hydrogenated silicon film, wherein the nitrogen accounts for, in percentage by volume, 5~20%, preferably 5~18%, and further preferably 5~10%, of the hydrogen-nitrogen mixed gas.

Preferably, on the basis of the technical solution of the present disclosure, a power of the Si target sputtering in Step (a) is 5%-80%, preferably 20%-80%, further preferably 40%-80%, further preferably 40%-70%, and further preferably 50%-70%, of a rated power; and/or, a power of activating the mixed gas through RF or ICP in Step (b) is 5%-80%, preferably 5%-50%, further preferably 15%-50%, and further preferably 20%-50%, of a rated power.

Preferably, a typical preparation method for a high-refractive-index hydrogenated silicon film includes following steps:

(a) placing a clean base body on a rotation mechanism of a vacuum sputtering reaction film coating machine, with a film coating face facing (toward) a target material, the rotation mechanism rotating at a constant speed in a film coating chamber; when a vacuum degree inside the film coating chamber is higher than $10^{-3}$Pa, starting (powering on) a sputter source and introducing argon to deposit Si on the base body by means of MF magnetron Si target sputtering, forming a silicon film;

(b) with the rotation of the rotation mechanism, driving the base body to a reaction source area, starting the reaction source and introducing hydrogen, oxygen, and argon to form plasmas which react with the silicon film, forming the oxygen-containing hydrogenated silicon film, the reaction source being an RF or ICP plasma activation source;

wherein, a power of the sputter source is 5%-80% of a rated power, a power of the reaction source is 5%-80% of a rated power, and the oxygen introduced accounts for, in percentage by volume, 4~99% of the total amount of the hydrogen and oxygen introduced.

Preferably, another typical preparation method for a high-refractive-index hydrogenated silicon film includes following steps:

(a) placing a clean base body on a rotation mechanism of a vacuum sputtering reaction film coating machine, with a film coating face facing a target material, the rotation mechanism rotating at a constant speed in a film coating chamber; when a vacuum degree inside the film coating chamber is higher than $10^{-3}$Pa, starting a sputter source and introducing argon to deposit Si on the base body by means of MF magnetron Si target sputtering, forming a silicon film;

(b) with the rotation of the rotation mechanism, driving the base body to a reaction source area, starting the reaction source and introducing hydrogen, nitrogen, and argon to form plasmas which react with the silicon film, forming an nitrogen-containing hydrogenated silicon film, the reaction source being an RF or ICP plasma activation source.

In the above, a power of the sputter source is 5%-80% of a rated power, a power of the reaction source is 5%-80% of a rated power, and the nitrogen introduced accounts for, in percentage by volume, 5~20% of a total amount of the hydrogen and nitrogen introduced.

Preferably, on the basis of the technical solution of the present disclosure, the rotation mechanism is one selected from a turn plate, a drum, and a rotating stand.

Preferably, on the basis of the technical solution of the present disclosure, the film coating chamber is provided with a baffle configured to divide the film coating chamber into a first chamber, in which the sputter source is located, and a second chamber, in which the reaction source is located.

Preferably, on the basis of the technical solution of the present disclosure, the film coating chamber is provided with a gas mixing chamber, hydrogen, oxygen, and argon are respectively introduced to the gas mixing chamber, and after being mixed well, the mixed gas is introduced to the film coating chamber to be activated; or, hydrogen, nitrogen, and argon are respectively introduced to the gas mixing chamber, and after being mixed well, the mixed gas is introduced to the film coating chamber to be activated.

Preferably, on the basis of the technical solution of the present disclosure, in Step (a), before starting the sputter source, it further includes heating the base body to a base body temperature of 100-300° C., subsequently, introducing argon to bombard and clean the film coating chamber and the base body; after the cleaning is completed, shutting off the argon, vacuuming the film coating chamber again to a vacuum degree of higher than $10^{-3}$Pa.

Preferably, the bombarding and cleaning lasts for 1~5 min, and a bombarding power is 5%-80% of a rated power.

Preferably, on the basis of the technical solution of the present disclosure, after Step (b) is ended, it further includes annealing the oxygen-containing hydrogenated silicon film or the nitrogen-containing hydrogenated silicon film in an annealing furnace at 100-300° C. for 60-180 min.

Preferably, on the basis of the technical solution of the present disclosure, annealing the oxygen-containing hydrogenated silicon film or the nitrogen-containing hydrogenated silicon film in an annealing furnace includes:

heating the oxygen-containing hydrogenated silicon film or the nitrogen-containing hydrogenated silicon film to 100-300° C. at a heating velocity of 1-15° C./min for 30-60 min;

subsequently, keeping the oxygen-containing hydrogenated silicon film or the nitrogen-containing hydrogenated silicon film at a constant temperature of 100-300° C. for 30-120 min;

subsequently, cooling the oxygen-containing hydrogenated silicon film or the nitrogen-containing hydrogenated silicon film to an ambient temperature at a cooling velocity of 10-30° C./min.

According to a second aspect, a high-refractive-index hydrogenated silicon film obtained through the above preparation method for a high-refractive-index hydrogenated silicon film is provided, the high-refractive-index hydrogenated silicon film has a refractive index of 1.46~3.7 over a wavelength range of 800~1100 nm, and the high-refractiveindex hydrogenated silicon film has an extinction coefficient of less than 0.0001 over the wavelength range of 800~1100 nm.

According to a third aspect, a filter stack is provided, including a plurality of the above high-refractive-index hydrogenated silicon films, and a plurality of low-refractive-index films are stacked in alternation there with, wherein the low-refractive-index films are films having a smaller refractive index over the wavelength range of 800~1100 nm than the refractive index of the high-refractive-index hydrogenated silicon film over the wavelength range of 800~1100 nm.

Preferably, on the basis of the technical solution of the present disclosure, the low-refractive-index films are silicon dioxide films;

preferably, the low-refractive-index films are low-refractive-index hydrogenated silicon films, and the low-refractive-index films are films having a smaller refractive index over the wavelength range of 800~1100 nm than the refractive index of the high-refractive-index hydrogenated silicon film over the wavelength range of 800~1100 nm;

preferably, a layer number of the filter stack is 10~100;

preferably, a thickness of the filter stack is 1~10 μm.

According to a fourth aspect, a filter is provided, which includes the above filter stack.

Compared with the prior art, the present disclosure has following beneficial effects:

(1) In the preparation method for a high-refractive index hydrogenated silicon film in the present disclosure, the magnetron sputtering method is firstly used to deposit Si on the base body by means of magnetron Si target sputtering, to form the silicon film, then the hydrogenated silicon film is formed through hydrogenation reaction in an environment containing active hydrogen, the sputtering process and the reaction process are separate and independent from each other, then the target material is not likely to be polluted by the reactive gas in the sputtering process, effectively avoiding the poisoning problem of the target material. Meanwhile, the active oxygen or the active nitrogen of a specific proportion is added to the environment containing active hydrogen, the oxidation reaction or the nitridation reaction takes place while the hydrogenation reaction is in progress, forming the oxygen-containing hydrogenated silicon film or the nitrogen-containing hydrogenated silicon film having a high refractive index and low absorption, besides, with this method, the production efficiency is improved, and the cost is reduced.

(2) The hydrogenated silicon film obtained by the preparation method for a high-refractive-index hydrogenated silicon film in the present disclosure, with the refractive index of 1.46~3.7 over the wavelength range of 800~1100 nm, and the extinction coefficient of less than 0.0001 over the wavelength range of 800~1100 nm, has a high refractive index and low absorption.

(3) For the filter stack in the present disclosure, the oxygen-containing or nitrogen-containing hydrogenated silicon films, taken as a high-refractive-index material, are stacked in alternation with a material with a lower refractive index than the above refractive index, such as silicon oxide and hydrogenated silicon with a high oxygen content, to form the filter stack with a high transmittance. The filter stack is coated on glass, resin substrate, to form an optical interference film bandpass filter, a long-wave pass filter, a short-wave pass filter and so on, such that when light is incident at a big angle, a central wavelength of the filter has a relatively small amount of offset, furthermore, a sensor has advantages of less signal loss, a high signal to noise ratio and so on within a relatively wide field of view, and can be applied to all filter devices and sensor systems requiring less offset effects, such as night viewing, 3D imaging, 3D modeling, face recognition, iris recognition, and gesture recognition.

(4) The filter in the present disclosure includes the above filter stack, and therefore has the same advantages as the above filter stack, such that the prepared filter has a relatively high transmittance and a small offset of the center wavelength.

Figure 1:
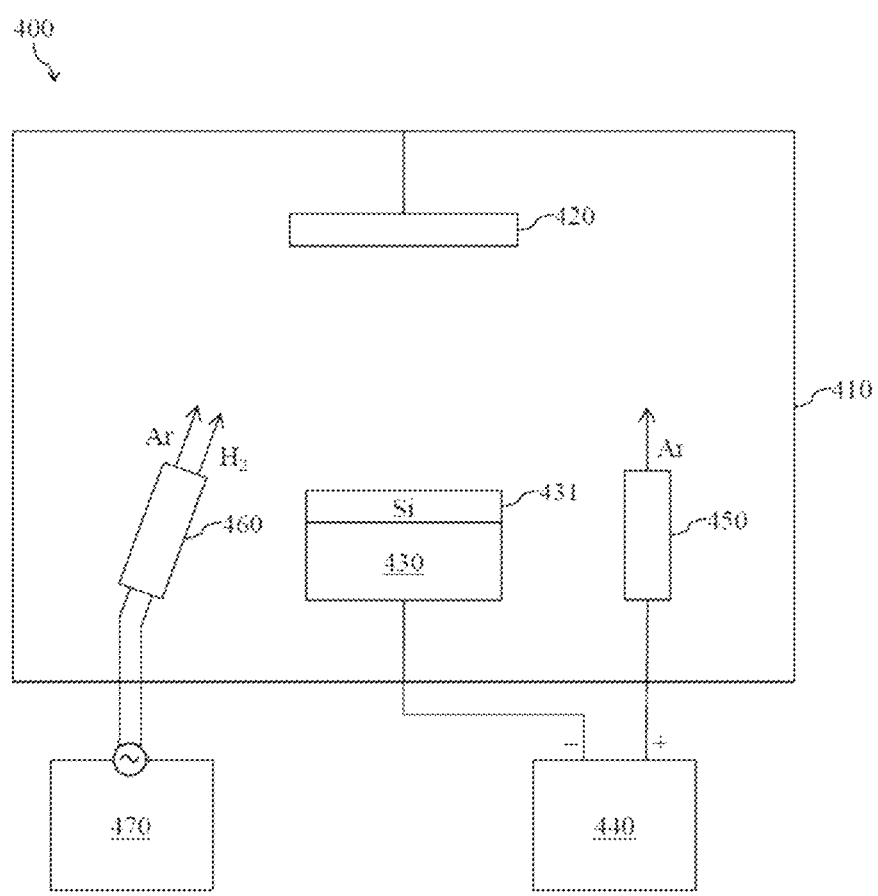
FIG. 1 is a structural schematic diagram of a sputter-deposition system in the prior art.

Reference signs: 100—substrate; 200—rotation mechanism; 300—sputter source; 400—reaction source; 500—film coating chamber; 600—baffle; 700—gas mixing chamber.

DETAILED DESCRIPTION OF EMBODIMENTS

Embodiments of the present disclosure will be described in detail below in combination with examples, while a person skilled in the art will understand that the following embodiments are merely for illustrating the present disclosure, but should not be considered as limitation to the scope of the present disclosure. If no specific conditions are specified in the embodiments, they are carried out under normal conditions or conditions recommended by the manufacturer. If the manufacturers of reagents or apparatus used are not specified, they are conventional products commercially available.

According to a first aspect of the present disclosure, a preparation method for a high-refractive-index hydrogenated silicon film is provided, including following steps:

(a) by means of magnetron Si target sputtering, depositing Si on a base body to form a silicon film;

(b) the silicon film forming an oxygen-containing hydrogenated silicon film in an environment containing active hydrogen and active oxygen, an amount of the active oxygen accounting for 4~99% of a total amount of the active hydrogen and the active oxygen, or, the silicon film forming a nitrogen-containing hydrogenated silicon film in an environment containing active hydrogen and active nitrogen, an amount of the active nitrogen accounting for 5~20% of a total amount of the active hydrogen and the active nitrogen.

In Step (a), what on the Si target is a monocrystalline or polycrystalline semiconductor high-purity silicon material.

Typical but non-limited base body for example is a monocrystalline Si chip, a glass sheet or a resin sheet.

Firstly, a magnetron sputtering method is used to deposit Si on the base body by means of magnetron Si target sputtering, to form the silicon film.

The magnetron sputtering, as a kind of Physical Vapor Deposition (PVD), has advantages of simple device, easy control, a big film coating area, a strong adhesive force and so on. The magnetron sputtering may be carried out in a vacuum sputtering film coating machine, the Si target is mounted on a Medium Frequency (MF) or Radio Frequency (RF) cathode, an inert gas (a typically but non-limited inert gas is for example argon) is introduced into a vacuum chamber, argon is ionized to form plasmas, which bombard the high-purity silicon target under effects of an electricity and a magnetic field, then the silicon material is sputtered onto a substrate to form the silicon film.

In Step (b), the active hydrogen may be obtained by activating hydrogen, the active hydrogen both in an atomic form and in a molecular form are considered as existing in plasmas, and the active hydrogen is more chemically active, and therefore may generate a Si—H bond with Si.

Likewise, the active oxygen may be obtained by activating oxygen, and a Si—O bond may be generated, and the active nitrogen may be obtained by activating nitrogen, and a Si—N bond may be generated.

Preferably, hydrogen and oxygen, or, hydrogen and nitrogen may be activated by a radio frequency (RF) or ICP (Inductive Coupled Plasma Emission Spectrometer) plasma activation source, so as to obtain the active hydrogen and the active oxygen or the active hydrogen and the active nitrogen, such that the active hydrogen and the active oxygen or the active hydrogen and the active nitrogen react with silicon to obtain the oxygen-containing hydrogenated silicon or the nitrogen-containing hydrogenated silicon.

An oxygen content or a nitrogen content in the hydrogenated silicon has an important influence on the refractive index and absorption of the film, and in order to obtain a hydrogenated silicon film having a high refractive index and low absorption, the oxygen content or the nitrogen content in the hydrogenated silicon needs to be controlled.

In Step (b), when the oxygen-containing hydrogenated silicon film is formed through the silicon film in an environment containing active hydrogen and active oxygen, the amount of the active oxygen is controlled to account for 4~99% of the total amount of the active hydrogen and the active oxygen, for example, one of 4%, 5%, 10%, 20%, 30%, 40%, 50%, 60%, 70%, 80%, 90%, 95%, and 99%, or a value within a range between any two thereof.

In Step (b), when the nitrogen-containing hydrogenated silicon film is formed through the silicon film in an environment containing active hydrogen and active nitrogen, the amount of the active nitrogen is controlled to account for 5~20% of the total amount of the active hydrogen and the active nitrogen, for example, one of 5%, 6%, 8%, 10%, 12%, 14%, 15%, 16%, 18%, and 20%, or a value within a range between any two thereof.

By adjusting the proportion of the active oxygen in the active hydrogen and the active oxygen, the oxygen content of the oxygen-containing hydrogenated silicon film is controlled, and a high-refractive-index and low-absorption hydrogenated silicon film of 800-1100 nm having a refractive index of 1.46-3.7 and an extinction coefficient of less than 0.0001 may be obtained. By adjusting the proportion of the active nitrogen in the active hydrogen and the active nitrogen, the nitrogen content of the nitrogen-containing hydrogenated silicon film is controlled, and a high-refractive-index and low-absorption hydrogenated silicon film of 800-1100 nm having a refractive index of 3.0-3.3 and an extinction coefficient of less than 0.0001 may be obtained.

When the content of the active oxygen/nitrogen is too low, it is not easy to control, and when the content of the active nitrogen is too high, although the refractive index is relatively high, the extinction coefficient is relatively large, then a desired film layer cannot be obtained.

After the silicon film is formed, the hydrogenated silicon film is obtained through hydrogenation reaction, and a certain amount of oxidation reaction or nitridation reaction takes place while the hydrogenation reaction is in progress, forming the oxygen-containing hydrogenated silicon film or the nitrogen-containing hydrogenated silicon film having a high refractive index and low absorption.

Preferably, this process may be carried out in the same vacuum sputtering film coating machine as in the above Step (a), but it should be noted that the two processes are carried out separately.

In the prior art, a method for obtaining hydrogenated silicon is a reactive sputtering manner, in which sputtering and reaction are carried out simultaneously, a target material is sputtered in an environment of reactive gas, then the target material is likely to be polluted by the hydrogen, causing problems such as unstable production.

In the present disclosure, a film coating chamber is divided by a baffle into a first chamber, in which a sputter source is located, and a second chamber, in which a reaction source is located. The first chamber and the second chamber are not divided in a completely independent and sealing manner in the present embodiment, while a substrate on a rotation mechanism is driven by rotation of the rotation mechanism to enter the first chamber to perform sputtering, and after the sputtering is completed, the substrate enters the second chamber to perform reaction with the mixed gas. In the present disclosure, the sputter source and the reaction source are physically separated by the baffle, meanwhile, when positions of the sputter source and the reaction source are set, the positions of the sputter source and the reaction source are set to be as distant as possible, to achieve relative independence, then the target material is not likely to be polluted by the reactive gas in the sputtering process, effectively avoiding the problem of poisoning of the target material.

In the preparation method of the present disclosure, firstly, the magnetron sputtering method is used to deposit Si on the base body by means of magnetron Si target sputtering, to form the silicon film, then the hydrogenated silicon film is formed through hydrogenation reaction in the environment containing active hydrogen, wherein the sputtering process and the reaction process are separate and independent from each other, then the target material is not likely to be polluted by the reactive gas in the sputtering process, effectively avoiding the problem of poisoning of the target material. Meanwhile, the active oxygen or the active nitrogen of a specific proportion is added to the environment containing active hydrogen, the oxidation reaction or the nitridation reaction takes place while the hydrogenation reaction is in progress, forming the oxygen-containing hydrogenated silicon film or the nitrogen-containing hydrogenated silicon film, which has a relatively high refractive index and lower absorption. Besides, this method may be implemented in a simple conventional vacuum sputtering film coating device or system, such that the production efficiency is improved, and the production cost is reduced.

Preferably, in Step (b), the amount of the active oxygen accounts for 4~70% of the total amount of the active hydrogen and the active oxygen, or, the amount of the active nitrogen accounts for 5~18% of the total amount of the active hydrogen and the active nitrogen.

Further preferably, in Step (b), the amount of the active oxygen accounts for 5~20% of the total amount of the active hydrogen and the active oxygen, or, the amount of the active nitrogen accounts for 5~10% of the total amount of the active hydrogen and the active nitrogen.

By further optimizing the proportion of the active oxygen/the active nitrogen in the active nitrogen and the active oxygen/the active nitrogen, so as to control the oxygen content/the nitrogen content of the hydrogenated silicon, the hydrogenated silicon film having a relatively low oxygen content/nitrogen content has a higher refractive index and lower absorption.

In a preferred embodiment, the preparation method for a high-refractive-index hydrogenated silicon film includes following steps:

(a) in the presence of an inert gas, by means of MF magnetron Si target sputtering, depositing Si on a base body to form a silicon film;

(b) in the presence of a mixed gas of hydrogen, oxygen, and an inert gas, activating the mixed gas through RF or ICP, to form plasmas which react with the silicon film, forming the oxygen-containing hydrogenated silicon film, wherein the oxygen accounts for, in percentage by volume, 4~99%, preferably 4~70%, and further preferably 5~20%, of the hydrogen-oxygen mixed gas, or, in the presence of a mixed gas of hydrogen, nitrogen, and an inert gas, activating the mixed gas through RF or ICP, to form plasmas which react with the silicon film, forming the nitrogen-containing hydrogenated silicon film, wherein the nitrogen accounts for, in percentage by volume, 5~20%, preferably 5~18%, and further preferably 5~10%, of the hydrogen-nitrogen mixed gas.

A typical but non-limited inert gas is argon.

This step may be carried out in the vacuum sputtering reaction film coating machine, and the monocrystalline or polycrystalline semiconductor silicon material is sputtered using plasmas of, for example, argon, such that the silicon material is sputtered in a nanoscale size onto a glass substrate. Then plasmas are formed through a mixed gas of hydrogen, oxygen, and argon at different proportions or a mixed gas of hydrogen, nitrogen, and argon at different proportions with the reaction source having the ICP or RF function, to perform the silicon material is subjected to hydro-oxidizing treatment or hydro-nitriding treatment, to finally form the hydrogenated silicon film with a certain content of oxygen or nitrogen.

In the above, the film coating chamber is provided with a gas mixing chamber, hydrogen, oxygen, and argon are respectively introduced to the gas mixing chamber, and after being mixed well, the mixed gas is introduced to the film coating chamber to be activated; or, hydrogen, nitrogen, and argon are respectively introduced to the gas mixing chamber, and after being mixed well, the mixed gas is introduced to the film coating chamber to be activated. In the present disclosure, by providing the gas mixing chamber, hydrogen, oxygen, and argon can be dispersed and mixed well, such that an effect is better when the mixed gas is activated using RF or ICP, avoiding occurrence of ununiformed activation effect if hydrogen, oxygen, and argon are directly introduced without being mixed.

When the mixed gas of hydrogen, oxygen, and the inert gas is introduced, the oxygen accounts for, in percentage by volume, 4~99%, for example, any one of 4%, 5%, 10%, 20%, 30%, 40%, 50%, 60%, 70%, 80%, 90%, 95%, and 99%, or a value within a range between any two thereof, for example, preferably 4~70%, and further preferably for example 5~20%, of the hydrogen-oxygen mixed gas.

When the mixed gas of hydrogen, nitrogen, and the inert gas is introduced, the nitrogen accounts for, in percentage by volume, 5~20%, for example, any one of 5%, 6%, 8%, 10%, 12%, 14%, 15%, 16%, 18%, and 20%, or a value within a range between any two thereof, for example, preferably 5~18%, and further preferably for example 5~10%, of the hydrogen-nitrogen mixed gas.

When the content of the introduced oxygen or nitrogen is too low, it is not easy to control, and when the nitrogen volume is too high, although the refractive index is relatively high, the extinction coefficient is relatively large, then a desired film layer cannot be obtained.

A small amount of oxygen or nitrogen is filled in when the high-refractive-index hydrogenated silicon film is coated, thus the extinction coefficient of the film layer is reduced, and further the transmittance of a film layer can be improved.

In a preferred embodiment, a power of the Si target sputtering in Step (a) is 5%-80%, preferably 20%-80%, further preferably 40%-80%, further preferably 40%-70%, and further preferably 50%-70%, of a rated power.

The rated power of the Si target sputtering for example is 15 KW, at which time a typical but non-limited Si target sputtering power in Step (a), for example, is any one of 0.75 KW, 1.5 KW, 3 KW, 6 KW, 7 KW, 8 KW, 9 KW, 10 KW, 11 KW, and 12 KW, or a value within a range between any two thereof.

In a preferred embodiment, a power of activating the mixed gas through RF or ICP in Step (b) is 5%-80%, preferably 5%-50%, further preferably 15%-50%, and further preferably 20%-50%, of a rated power.

The power of activating the mixed gas through RF or ICP typically refers to a power of the reaction source having the ICP or RF function, and a rated power of a power of the reaction source for example is 10 KW, at which time, a typical but non-limited power of the reaction source for example is any one of 0.5 KW, 1 KW, 2 KW, 3 KW, 4 KW, 5 KW, 6 KW, 7 KW, and 8 KW, or a value within a range between any two thereof.

By adjusting the sputtering power and the reaction power, the refractive index and absorption of the film also will be influenced to a certain extent, therefore, in order to obtain a film having a high refractive index and low absorption, corresponding parameters such as the sputtering power and the reaction power also need to be adjusted, and it should be noted that specific numerical values of parameters of different machines may be slightly different, and they may be adjusted according to practical situations.

Preferably, a typical preparation method for a high-refractive-index oxygen-containing hydrogenated silicon film includes following steps:

(a) placing a clean base body on a rotation mechanism of a vacuum sputtering reaction film coating machine, with a film coating face facing a target material, the rotation mechanism rotating at a constant speed in a film coating chamber; when a vacuum degree inside the film coating chamber is higher than $10^{-3}$ Pa, starting a sputter source and introducing argon to deposit Si on the base body by means of MF magnetron Si target sputtering, forming a silicon film;

(b) with the rotation of the rotation mechanism, driving the base body to a reaction source area, starting the reaction source and introducing hydrogen, oxygen, and argon to form plasmas which react with the silicon film, forming an oxygen-containing hydrogenated silicon film, the reaction source being an RF or ICP plasma activation source;

wherein, a power of the sputter source is 5%-80% of a rated power, a power of the reaction source is 5%-80% of a rated power, and the oxygen introduced accounts for, in percentage by volume, 4~99% of a total amount of the hydrogen and oxygen introduced.

The rated power of the sputter source for example is 15 KW, at which time a typical but non-limited power of the sputter source for example is any one of 0.75 KW, 1.5 KW, 3 KW, 6 KW, 7 KW, 8 KW, 9 KW, 10 KW, 11 KW, and 12 KW, or a value within a range between any two thereof, the rated power of the reaction source for example is 10 KW, at which time a typical but non-limited power of the reaction source for example is any one of 0.5 KW, 1 KW, 2 KW, 3 KW, 4 KW, 5 KW, 6 KW, 7 KW, and 8 KW, or a value within a range between any two thereof, the oxygen introduced accounts for, in percentage by volume, for example, any one of 4%, 5%, 10%, 20%, 30%, 40%, 50%, 60%, 70%, 80%, 90%, 95%, and 99%, or a value within a range between any two thereof, of a total amount of the hydrogen and oxygen introduced.

The percentage by volume of the oxygen introduced in the mixed gas of the hydrogen and oxygen introduced may be reached by adjusting each gas flow rate (sccm).

Further, a typical preparation method for a high-refractive-index oxygen-containing hydrogenated silicon film includes following steps:

(a) placing a clean base body on a rotation mechanism of a vacuum sputtering reaction film coating machine, with a film coating face facing a target material, the rotation mechanism rotating at a constant speed in a film coating chamber; when a vacuum degree inside the film coating chamber is higher than $10^{-3}$ Pa, heating the base body to 100-300° C., subsequently, introducing argon to bombard and clean the film coating chamber and the base body; after the cleaning is completed, shutting off the argon, vacuumizing the film coating chamber again to a vacuum degree of higher than $10^{-3}$ Pa; starting a sputter source and introducing argon to deposit Si on the base body by means of MF magnetron Si target sputtering, forming a silicon film;

(b) with the rotation of the rotation mechanism, driving the base body to a reaction source area, starting the reaction source and introducing hydrogen, oxygen, and argon to form plasmas which react with the silicon film, forming an oxygen-containing hydrogenated silicon film, the reaction source being an RF or ICP plasma activation source;

(c) annealing the oxygen-containing hydrogenated silicon film in an annealing furnace at 100-300° C. for 60-180 min, wherein specifically, the oxygen-containing hydrogenated silicon film is heated to 100-300° C. at a velocity of 1-15° C./min for 30-60 min; subsequently, the oxygen-containing hydrogenated silicon film is kept at a constant temperature of 100-300° C. for 30-120 min; subsequently, the oxygen-containing hydrogenated silicon film is cooled to an ambient temperature at a cooling velocity of 10-30° C./min, and taken out. In the above, the bombarding and cleaning lasts for 1-5 min, and a bombarding power is 5%-80% of a rated power.

In the present disclosure, the oxygen-containing hydrogenated silicon film undergoes an annealing treatment through a specific annealing process with specific parameters, with specific parameters such as a heating velocity, a cooling velocity, and an annealing period being limited, which facilitates improvements on structural and optical properties thereof and shows relatively good thermal stability. Preferably, a typical preparation method for a high-refractive-index nitrogen-containing hydrogenated silicon film includes following steps:

(a) placing a clean base body on a rotation mechanism of a vacuum sputtering reaction film coating machine, with a film coating face facing a target material, the rotation mechanism rotating at a constant speed in a film coating chamber; when a vacuum degree inside the film coating chamber is higher than $10^{-3}$ Pa, starting a sputter source and introducing argon to deposit Si on the base body by means of MF magnetron Si target sputtering, forming a silicon film;

(b) with the rotation of the rotation mechanism, driving the base body to a reaction source area, starting the reaction source and introducing hydrogen, nitrogen, and argon to form plasmas which react with the silicon film, forming a nitrogen-containing hydrogenated silicon film, the reaction source being an RF or ICP plasma activation source;

wherein, a power of the sputter source is 5%-80% of a rated power, a power of the reaction source is 5%-80% of a rated power, and the nitrogen introduced accounts for 5~20% of a total amount of the hydrogen and nitrogen introduced, in percentage by volume.

The rated power of the sputter source for example is 15 KW, at which time a typical but non-limited power of the sputter source for example is any one of 0.75 KW, 1.5 KW, 3 KW, 6 KW, 7 KW, 8 KW, 9 KW, 10 KW, 11 KW, and 12 KW or, a value within a range between any two thereof, a rated power of the reaction source for example is 10 KW, at which time, a typical but non-limited power of the reaction source for example is any one, or a value within a range between any two of 1.5 KW, 2 KW, 3 KW, 4 KW, 5 KW, 6 KW, 7 KW, and 8 KW, the introduced nitrogen accounts for, in percentage by volume, for example, any one of 5%, 6%, 8%, 10%, 12%, 14%, 15%, 16%, 18%, and 20%, or a value within a range between any two thereof, of a total amount of the hydrogen and nitrogen introduced.

The percentage by volume of the nitrogen introduced in the mixed gas of the hydrogen and nitrogen introduced may be achieved by adjusting each gas flow rates (sccm).

Further, a typical preparation method for a high-refractive-index nitrogen-containing hydrogenated silicon film includes following steps:

(a) placing a clean base body on a rotation mechanism of a vacuum sputtering reaction film coating machine, with a film coating face facing a target material, the rotation mechanism rotating at a constant speed in a film coating chamber; when a vacuum degree inside the film coating chamber is higher than $10^{-3}$Pa, heating the base body to 100-300° C., subsequently, introducing argon to bombard and clean the film coating chamber and the base body; after the cleaning is completed, shutting off the argon, vacuuming the film coating chamber again to a vacuum degree of higher than $10^{-3}$Pa; starting a sputter source and introducing argon to deposit Si on the base body by means of MF magnetron Si target sputtering, forming a silicon film;

(b) with the rotation of the rotation mechanism, driving the base body to a reaction source area, starting the reaction source and introducing hydrogen, nitrogen, and argon to form plasmas which react with the silicon film, forming a nitrogen-containing hydrogenated silicon film, the reaction source being an RF or ICP plasma activation source;

(c) annealing the nitrogen-containing hydrogenated silicon film in an annealing furnace at 100-300° C. for 60-180 min, wherein specifically, the nitrogen-containing hydrogenated silicon film is heated to 100-300° C. at a velocity of 1-15° C./min for 30-60 min; subsequently, the nitrogen-containing hydrogenated silicon film is kept at a constant temperature of 100-300° C. for 30-120 min; subsequently, the nitrogen-containing hydrogenated silicon film is cooled to an ambient temperature at a cooling velocity of 10-30° C./min, and taken out. In the above, the bombarding and cleaning lasts for 1~5 min, and a bombarding power is 5%-80% of a rated power. A rated power of the bombarding for example is 10 KW, at which time in the present embodiment, the bombarding power for example may be 0.5-8 KW.

In the present disclosure, the nitrogen-containing hydrogenated silicon film undergoes an annealing treatment through a specific annealing process with specific parameters, with specific parameters such as a heating velocity, a cooling velocity, and an annealing period being limited, which facilitates improvements on structural and optical properties thereof and shows relatively good thermal stability. The typical preparation method for an oxygen-containing hydrogenated silicon film or a nitrogen-containing hydrogenated silicon film may be carried out in a vacuum sputtering reaction film coating system, FIG. 2 is a structural schematic diagram of the vacuum sputtering reaction film coating system according to an embodiment of the present disclosure.

Figure 2:
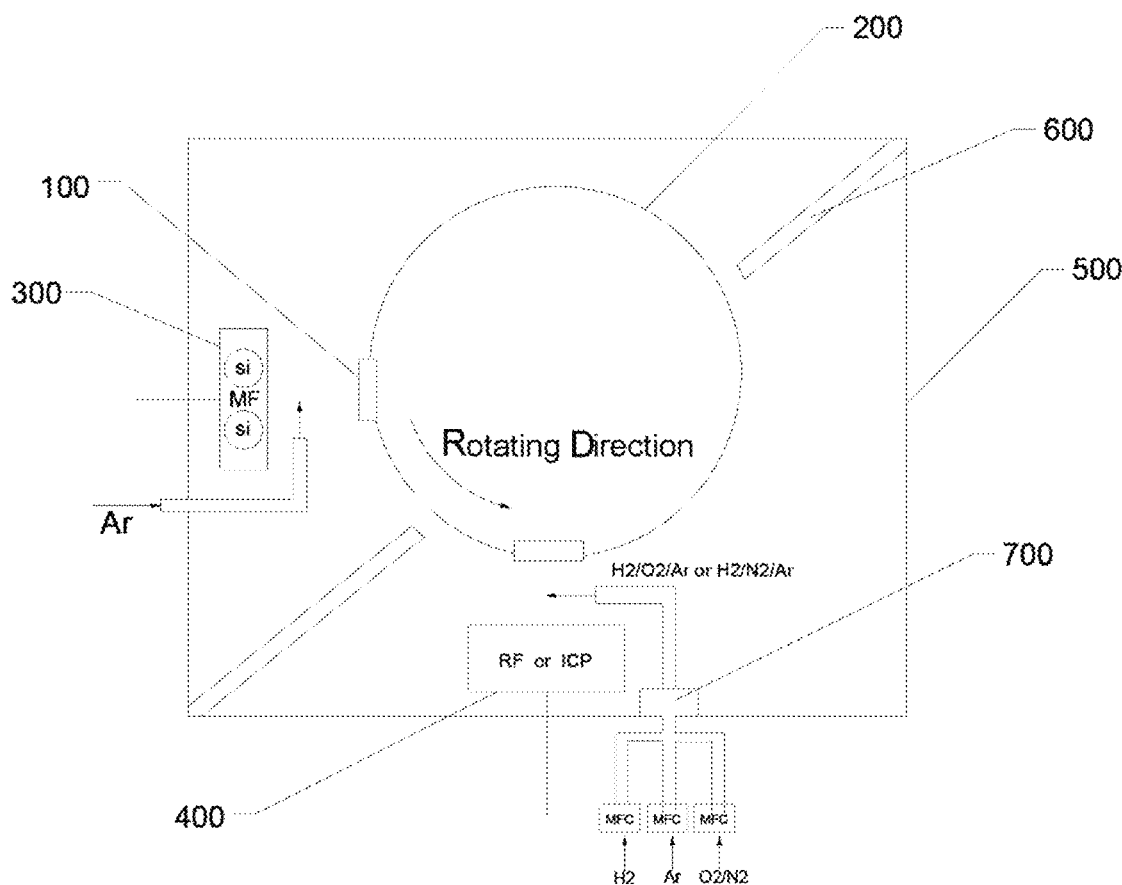
FIG. 2 is a structural schematic diagram of a vacuum sputtering reaction film coating system according to an embodiment of the present disclosure.

A preparation process for an oxygen-containing hydrogenated silicon film is illustrated in combination with FIG. 2:

A. a clean substrate 100 is placed on a rotation mechanism 200, with a film coating face facing a target material;

B. the rotation mechanism 200 rotates at a constant speed in a film coating chamber 500;

C. when a vacuum degree is higher than $10^{-3}$Pa, a base body is heated to a base body temperature of 100-300° C., subsequently, argon is introduced to bombard and clean the film coating chamber and the base body; after the cleaning is completed, the argon is shut off, the film coating chamber is vacuumed again to a vacuum degree of higher than $10^{-3}$Pa; a sputter source 300 located in a first chamber is started and argon is introduced therein, the argon is ionized to form plasmas, which bombard a high-purity silicon target under effects of an electricity and a magnetic field, and the silicon material is sputtered onto the substrate 100;

D. with the rotation of the rotation mechanism 200, the substrate 100 is driven to a reaction source (RF/ICP) area located inside a second chamber, wherein a sputter source 300 and a reaction source 400 are spaced apart by a baffle 600;

E. hydrogen, oxygen, and argon are introduced to the reaction source 400 area, the hydrogen, the oxygen, and the argon are well mixed in a gas mixing chamber 700 and discharged, forming plasmas, which move at high speed towards the substrate 100 under an effect of an electric field, and finally react with the silicon film on the substrate 100, forming an oxygen-containing hydrogenated silicon film;

F. the oxygen-containing hydrogenated silicon film is heated in an annealing furnace to 100-300° C. at a heating velocity of 1-15° C./min for 30-60 min; subsequently, the oxygen-containing hydrogenated silicon film is kept at a constant temperature of 100-300° C. for 30-120 min; subsequently, the oxygen-containing hydrogenated silicon film is cooled to an ambient temperature at a cooling velocity of 10-30° C./min, and taken out. A power parameter of the sputter source ranges 5%-80% of a rated power, a power parameter of the reaction source ranges 5%-80% of a rated power, and the oxygen introduced accounts for, in percentage by volume, 4~99% of a total amount of the hydrogen and oxygen introduced. The bombarding and cleaning lasts for 1~5 min, and a bombarding power is 5%-80% of a rated power. The rotation mechanism 200 may be one selected from a turn plate, a drum, and a rotating stand.

A preparation process for the nitrogen-containing hydrogenated silicon film is illustrated in combination with FIG. 2:

A. a clean substrate 100 is placed on a rotation mechanism 200, with a film coating face facing a target material;

B. the rotation mechanism 200 rotates at a constant speed in a film coating chamber 500;

C. when a vacuum degree is higher than $10^{-3}$Pa, a base body is heated to a base body temperature of 100-300° C., subsequently, argon is introduced to bombard and clean the film coating chamber and the base body; after the cleaning is completed, the argon is shut off, the film coating chamber is vacuumed again to a vacuum degree of higher than $10^{-3}$Pa; a sputter source 300 located in a first chamber is started and argon is introduced therein, the argon is ionized to form plasmas, which bombard a high-purity silicon target under effects of an electricity and a magnetic field, and the silicon material is sputtered onto the substrate 100;

D. with the rotation of the rotation mechanism 200, the substrate 100 is driven to a reaction source (RF/ICP) area located inside a second chamber, wherein a sputter source 300 and a reaction source 400 are spaced apart by a baffle 600;

E. hydrogen, nitrogen, and argon are introduced to the reaction source 400 area, the hydrogen, the nitrogen, and the argon are well mixed in a gas mixing chamber and discharged, forming plasmas, which move at high speed towards the substrate 100 under an effect of an electric field, and finally react with the silicon film on the substrate 100, forming a nitrogen-containing hydrogenated silicon film.

F. The nitrogen-containing hydrogenated silicon film is heated in an annealing furnace to 100-300° C. at a heating velocity of 1-15° C./min for 30-60 min; subsequently, the nitrogen-containing hydrogenated silicon film is kept at a constant temperature of 100-300° C. for 30-120 min; subsequently, the nitrogen-containing hydrogenated silicon film is cooled to an ambient temperature at a cooling velocity of 10-30° C./min, and taken out.

A power parameter of the sputter source ranges 5%-80% of a rated power, a power parameter of the reaction source ranges 5%-80% of a rated power, and the nitrogen introduced accounts for, in percentage by volume, 5~20% of a total amount of the hydrogen and nitrogen introduced. The bombarding and cleaning lasts for 1-5 min, and a bombarding power is 5%-80% of a rated power. The rotation mechanism 200 may be one selected from a turn plate, a drum, and a rotating stand.

A glass substrate is arranged on a dome cover of the rotation mechanism, and rotates in an anticlockwise direction with the dome cover of the rotation mechanism dome at a variable speed, and the film-coated substrate firstly passes through the sputter source, after being deposited with a very thin layer of silicon, rotates to the reaction source to be formed into an optical film with desired properties by plasmas consisting of hydrogen-oxygen-argon, or hydrogen-nitrogen-argon ions and electrons and so on. During the preparation of the high-refractive-index film, by adjusting the proportions (flow rates) of hydrogen and oxygen, and the proportions (flow rates) of hydrogen and nitrogen in the mixed gas filled in the reaction source, a film of 800~1100 nm with a lowest refractive index gradually ranging 1.46~3.7 and an extinction coefficient of less than 0.0001 may be prepared. When the gas filled in the reaction source is a mixed gas of hydrogen, oxygen, and argon with a high proportion of oxygen, or a mixed gas of pure oxygen, hydrogen, and argon, a film of 800~1100 nm with a refractive index gradually ranging 1.46~1.7 and an extinction coefficient of less than 0.0001 may be prepared.

It should be particularly indicated that the proportion of the oxygen or the nitrogen in the mixed gas of the reaction source is an important parameter, and if it is desired to obtain a film with a high refractive index and low absorption, corresponding parameters such as a sputtering power and a reaction power also need to be adjusted, and specific numerical values of parameters of different machines may not be the same.

A small amount of oxygen or nitrogen is filled in when the high-refractive-index hydrogenated silicon film is coated, thus the extinction coefficient of the film layer is reduced, and further the transmittance of a multi-layer film can be improved.

According to a second aspect of the present disclosure, a high-refractive-index hydrogenated silicon film obtained using the above preparation method for a high-refractive-index hydrogenated silicon film is provided.

The high-refractive-index hydrogenated silicon film has a refractive index of 1.46~3.7 over a wavelength range of 800~1100 nm, and the high-refractive-index hydrogenated silicon film has an extinction coefficient of less than 0.0001 over the wavelength range of 800~1100 nm.

According to a third aspect of the present disclosure, a filter stack is provided, including a plurality of the above high-refractive-index hydrogenated silicon films, and a plurality of low-refractive-index films are stacked in alternation there with.

The low-refractive-index films refer to films having a smaller refractive index over the wavelength range of 800~1100 nm than the refractive index, which is in the present disclosure, of the high-refractive-index hydrogenated silicon film over the wavelength range of 800~1100 nm.

In a preferred embodiment, the low-refractive-index films are silicon dioxide films.

The silicon dioxide films usually have a refractive index of 1.46-1.50, belonging to films with a relatively low refractive index, and they are stacked in alternation with the hydrogenated silicon films with a refractive index higher than that of the silicon dioxide films, to constitute the filter stack.

In a preferred embodiment, the low-refractive-index films are low-refractive-index hydrogenated silicon films.

The low refractive index in the low-refractive-index hydrogenated silicon films herein is a relative quantity, meaning that in the stacked film structure, the refractive index of such hydrogenated silicon films is smaller than the refractive index of the high-refractive-index hydrogenated silicon films in the present disclosure. For example, the hydrogenated silicon film obtained using the method of the present disclosure has a refractive index of 3, then the low-refractive-index hydrogenated silicon films refer to all hydrogenated silicon films having a refractive index of less than 3, and they may be hydrogenated silicon films obtained through a conventional method, and also may be hydrogenated silicon films having a high oxygen content using the method of the present disclosure.

Preferably, a layer number of the filter stack is 10~100.

Preferably, a thickness of the filter stack is 1~10 μm.

The filter stack includes a plurality of hydrogenated silicon films as high-refractive-index layers and a plurality of low-refractive-index layers, which are stacked in alternation. Generally, the filter stack may be comprised by a plurality of hydrogenated silicon layers and a plurality of low-refractive-index layers stacked in an order of (high/low) n, (high/low)n high or low(high/low)n. Generally, the filter stack includes 10 to 100 layers in total, that is, $5 \leq n \leq 50$. Likewise, in general, each hydrogenated silicon layer and each low-refractive-index layer has a thickness of 3~300 nm, and the filter stack has a thickness of 1~10 μm. Generally speaking, the layer number and the thickness are selected according to a specific optical design.

According to a fourth aspect of the present disclosure, a filter containing the above filter stack is provided.

A typical but non-limited filter for example is a bandpass filter, a long-wave pass filter or a short-wave pass filter.

For the filter stack in the present disclosure, the oxygen-containing or nitrogen-containing hydrogenated silicon films, taken as a high-refractive-index material, are stacked in alternation with a material with a lower refractive index than the above refractive index, such as silicon oxide and hydrogenated silicon with a high oxygen content, to form the filter stack with a high transmittance. The filter stack is coated on glass, resin substrate, to form an optical interference film bandpass filter, a long-wave pass filter, a short-wave pass filter and so on, such that when light is incident at a big angle, a central wavelength of the filter has a relatively small amount of offset, furthermore, a sensor has advantages of less signal loss, a high signal to noise ratio and so on within a relatively wide field of view, and can be applied to all filter devices and sensor systems requiring less offset effects, such as night viewing, 3D imaging, 3D modeling, face recognition, iris recognition, and gesture recognition.

The present disclosure is further described below through embodiments and comparative examples. However, it should be understood that these embodiments are merely for more detailed description, but should not be construed as limiting the present disclosure in any form. All of various raw materials involved in the present disclosure are commercially available.

The preparation method for a high-refractive-index oxygen-/nitrogen- containing hydrogenated silicon film in the embodiments is implemented using an NSP1650 sputtering film coating system (as shown in FIG. 2) from OPTORUN CO. LTD, and the substrate is a glass substrate.

Embodiment 1

A preparation method for a high-refractive-index oxygen-containing hydrogenated silicon film includes following steps:

(a) a clean substrate is placed on a drum, with a film coating face facing a target material; (b) the drum rotates at a constant speed in a film coating chamber; (c) a sputter source is started and argon is introduced therein when a vacuum degree is higher than $10^{-3}$Pa, wherein the sputter source has a power of 8 KW, argon is ionized to form plasmas, which bombard a high-purity silicon target under effects of an electricity and a magnetic field, and a silicon material is sputtered onto the substrate;

(d) the substrate is driven to a reaction source area with the rotation of the drum;

(e) the reaction source is started, wherein the reaction source has a power of 2 KW, hydrogen, oxygen, and argon are introduced to the reaction source area, a gas flow rate is adjusted, such that the oxygen introduced accounts for, in percentage by volume, 6% of a total amount of the hydrogen and oxygen introduced, the gas is activated to form plasmas, which move at high speed towards the substrate under an effect of an electric field, and finally react with a silicon film on the substrate, forming an oxygen-containing hydrogenated silicon film.

Embodiment 2

In a preparation method for a high-refractive-index oxygen-containing hydrogenated silicon film, in Step (e), the oxygen introduced accounts for, in percentage by volume, 14% of the total amount of the hydrogen and oxygen introduced, and other steps and parameters are the same as those in Embodiment 1.

Embodiment 3

In a preparation method for a high-refractive-index oxygen-containing hydrogenated silicon film, in Step (e), the oxygen introduced accounts for, in percentage by volume, 23% of the total amount of the hydrogen and oxygen introduced, and other steps and parameters are the same as those in Embodiment 1.

Embodiment 4

In a preparation method for a high-refractive-index oxygen-containing hydrogenated silicon film, in Step (e), the oxygen introduced accounts for, in percentage by volume, 58% of the total amount of the hydrogen and oxygen introduced, and other steps and parameters are the same as those in Embodiment 1.

Embodiment 5

In a preparation method for a high-refractive-index oxygen-containing hydrogenated silicon film, in Step (e), the oxygen introduced accounts for, in percentage by volume, 62% of the total amount of the hydrogen and oxygen introduced, and other steps and parameters are the same as those in Embodiment 1.

Embodiment 6

In a preparation method for a high-refractive-index oxygen-containing hydrogenated silicon film, in Step (e), the oxygen introduced accounts for, in percentage by volume, 67% of the total amount of the hydrogen and oxygen introduced, and other steps and parameters are the same as those in Embodiment 1.

Embodiment 7

In a preparation method for a high-refractive-index oxygen-containing hydrogenated silicon film, in Step (e), the oxygen introduced accounts for, in percentage by volume, 71% of the total amount of the hydrogen and oxygen introduced, and other steps and parameters are the same as those in Embodiment 1.

Embodiment 8

In a preparation method for a high-refractive-index oxygen-containing hydrogenated silicon film, in Step (c), the sputter source has a power of 6 KW, and other steps and parameters are the same as those in Embodiment 1.

Embodiment 9

In a preparation method for a high-refractive-index oxygen-containing hydrogenated silicon film, in Step (c), the sputter source has a power of 12 KW, and other steps and parameters are the same as those in Embodiment 1.

Embodiment 10

In a preparation method for a high-refractive-index oxygen-containing hydrogenated silicon film, in Step (c), the sputter source has a power of 1 KW, and other steps and parameters are the same as those in Embodiment 1.

Embodiment 11

In a preparation method for a high-refractive-index oxygen-containing hydrogenated silicon film, in Step (c), the sputter source has a power of 20 KW, and other steps and parameters are the same as those in Embodiment 1.

Embodiment 12

In a preparation method for a high-refractive-index oxygen-containing hydrogenated silicon film, in Step (e), the reaction source has a power of 0.5 KW, and other steps and parameters are the same as those in Embodiment 1.

Embodiment 13

In a preparation method for a high-refractive-index oxygen-containing hydrogenated silicon film, in Step (e), the reaction source has a power of 5 KW, and other steps and parameters are the same as those in Embodiment 1.

Embodiment 14

In a preparation method for a high-refractive-index oxygen-containing hydrogenated silicon film, in Step (e), the reaction source has a power of 10 KW, and other steps and parameters are the same as those in Embodiment 1.

Embodiment 15

A preparation method for a high-refractive-index oxygen-containing hydrogenated silicon film includes following steps:

(a) a clean substrate is placed on a drum, with a film coating face facing a target material;

(b) a turn plate rotates at a constant speed in a film coating chamber;

(c) when a vacuum degree is higher than $10^{-3}$Pa, a base body is heated to a base body temperature of 160° C., subsequently, argon is introduced to bombard and clean the film coating chamber and the base body, wherein the bombarding and cleaning lasts for 3 min, and a bombarding power is 2.3 KW; after the cleaning is completed, the argon is shut off, the film coating chamber is vacuumed again to a vacuum degree of $10^{-3}$Pa; a sputter source, which has a power of 8 KW, is started and argon is introduced therein, the argon is ionized to form plasmas, which bombard a high-purity silicon target under effects of an electricity and a magnetic field, and a silicon material is sputtered onto the substrate;

(d) the substrate is driven to a reaction source area with the rotation of the turn plate;

(e) the reaction source is started, wherein the reaction source has a power of 2 KW, hydrogen, oxygen, and argon are introduced to the reaction source area, a gas flow rate is adjusted, such that the oxygen introduced accounts for, in percentage by volume, 6% of a total amount of the hydrogen and oxygen introduced, the hydrogen, the oxygen, and the argon are well mixed in a gas mixing chamber and discharged, and the gases are activated to form plasmas, which move at high speed towards the substrate under an effect of an electric field, and finally react with a silicon film on the substrate, forming the oxygen-containing hydrogenated silicon film;

(f) the oxygen-containing hydrogenated silicon film is heated in an annealing furnace to 200° C. at a velocity of 10° C./min for 30 min; subsequently, the oxygen-containing hydrogenated silicon film is kept at a constant temperature of 200° C. for 30 min; subsequently, the oxygen-containing hydrogenated silicon film is cooled to an ambient temperature at a cooling velocity of 15° C./min, and taken out.

Embodiment 16

A preparation method for a high-refractive-index oxygen-containing hydrogenated silicon film includes following steps:

(a) a clean substrate is placed on a drum, with a film coating face facing a target material;

(b) a turn plate rotates at a constant speed in a film coating chamber;

(c) when a vacuum degree is higher than $10^{-3}$Pa, a base body is heated to a base body temperature of 100° C., subsequently, argon is introduced to bombard and clean the film coating chamber and the base body, wherein the bombarding and cleaning lasts for 1 min, and a bombarding power is 0.6 KW; after the cleaning is completed, the argon is shut off, the film coating chamber is vacuumed again to a vacuum degree of $10^{-3}$Pa; a sputter source, which has a power of 8 KW, is started and argon is introduced therein, the argon is ionized to form plasmas, which bombard a high-purity silicon target under effects of an electricity and a magnetic field, and a silicon material is sputtered onto the substrate;

(d) the substrate is driven to a reaction source area with the rotation of the turn plate;

(e) the reaction source is started, wherein the reaction source has a power of 2 KW, hydrogen, oxygen, and argon are introduced to the reaction source area, a gas flow rate is adjusted, such that the oxygen introduced accounts for, in percentage by volume, 6% of a total amount of the hydrogen and oxygen introduced, the hydrogen, the oxygen, and the argon are well mixed in a gas mixing chamber and discharged, and the gases are activated to form plasmas, which move at high speed towards the substrate under an effect of an electric field, and finally react with a silicon film on the substrate, forming the oxygen-containing hydrogenated silicon film;

(f) the oxygen-containing hydrogenated silicon film is heated in an annealing furnace to 100° C. at a velocity of 2° C./min for 60 min; subsequently, the oxygen-containing hydrogenated silicon film is kept at a constant temperature of 100° C. for 120 min; subsequently, the oxygen-containing hydrogenated silicon film is cooled to an ambient temperature at a cooling velocity of 10° C./min, and taken out.

Embodiment 17

A preparation method for a high-refractive-index oxygen-containing hydrogenated silicon film includes following steps:

(a) a clean substrate is placed on a drum, with a film coating face facing a target material;

(b) a turn plate rotates at a constant speed in a film coating chamber;

(c) when a vacuum degree is higher than $10^{-3}$Pa, a base body is heated to a base body temperature of 300° C., subsequently, argon is introduced to bombard and clean the film coating chamber and the base body, wherein the bombarding and cleaning lasts for 5 min, and a bombarding power is 4 KW; after the cleaning is completed, the argon is shut off, the film coating chamber is vacuumed again to a vacuum degree of $10^{-3}$Pa; a sputter source, which has a power of 8 KW, is started and argon is introduced therein, the argon is ionized to form plasmas, which bombard a high-purity silicon target under effects of an electricity and a magnetic field, and a silicon material is sputtered onto the substrate;

(d) the substrate is driven to a reaction source area with the rotation of the turn plate;

(e) the reaction source is started, wherein the reaction source has a power of 2 KW, hydrogen, oxygen, and argon are introduced to the reaction source area, a gas flow rate is adjusted, such that the oxygen introduced accounts for, in percentage by volume, 6% of a total amount of the hydrogen and oxygen introduced, the hydrogen, the oxygen, and the argon are well mixed in a gas mixing chamber and discharged, and the gases are activated to form plasmas, which move at high speed towards the substrate under an effect of an electric field, and finally react with a silicon film on the substrate, forming the oxygen-containing hydrogenated silicon film;

(f) the oxygen-containing hydrogenated silicon film is heated in an annealing furnace to 300° C. at a velocity of 15° C./min for 40 min; subsequently, the oxygen-containing hydrogenated silicon film is kept at a constant temperature of 300° C. for 80 min; subsequently, the oxygen-containing hydrogenated silicon film is cooled to an ambient temperature at a cooling velocity of 30° C./min, and taken out.

Comparative Example 1

In a preparation method for a silicon dioxide film, in Step (e), oxygen and argon are introduced, but hydrogen is not introduced, and other steps and parameters are the same as those in Embodiment 1, to obtain a silicon dioxide film.

Test Example 1

A refractive index and an extinction coefficient under 940 nm are measured for the oxygen-containing hydrogenated silicon films obtained in Embodiments 1-21 and Comparative Example 1, a measuring method is a conventional measurement manner in the art.

Test results are listed in Table 1.

TABLE 1

| Embodiments or Comparative Examples | refractive index n | extinction coefficient k |
|---|---|---|
| Embodiment 1 | 3.499 | $6.30 \times 10^{-04}$ |
| Embodiment 2 | 3.463 | $2.75 \times 10^{-04}$ |
| Embodiment 3 | 3.045 | $1.26 \times 10^{-04}$ |
| Embodiment 4 | 2.173 | $4.92 \times 10^{-06}$ |
| Embodiment 5 | 2.061 | $3.33 \times 10^{-06}$ |
| Embodiment 6 | 1.846 | $1.2 \times 10^{-05}$ |
| Embodiment 7 | 1.711 | $3.42 \times 10^{-06}$ |
| Embodiment 8 | 3.502 | $6.30 \times 10^{-04}$ |
| Embodiment 9 | 3.486 | $6.24 \times 10^{-04}$ |
| Embodiment 10 | 3.268 | $1.68 \times 10^{-04}$ |
| Embodiment 11 | 3.363 | $3.75 \times 10^{-04}$ |
| Embodiment 12 | 3.436 | $5.82 \times 10^{-04}$ |
| Embodiment 13 | 3.517 | $6.64 \times 10^{-04}$ |
| Embodiment 14 | 3.180 | $2.85 \times 10^{-04}$ |
| Embodiment 15 | 3.526 | $4.16 \times 10^{-04}$ |
| Embodiment 16 | 3.483 | $6.41 \times 10^{-04}$ |
| Embodiment 17 | 3.557 | $5.72 \times 10^{-04}$ |
| Comparative Example 1 | 1.488 | $8.94 \times 10^{-07}$ |

It can be seen from Table 1 that the oxygen-containing hydrogenated silicon film obtained through the method of the present disclosure (the oxygen accounting for 4~99% of a hydrogen-oxygen mixed gas) has a refractive index of 1.46-3.7 under 940 nm.

Figure 3:
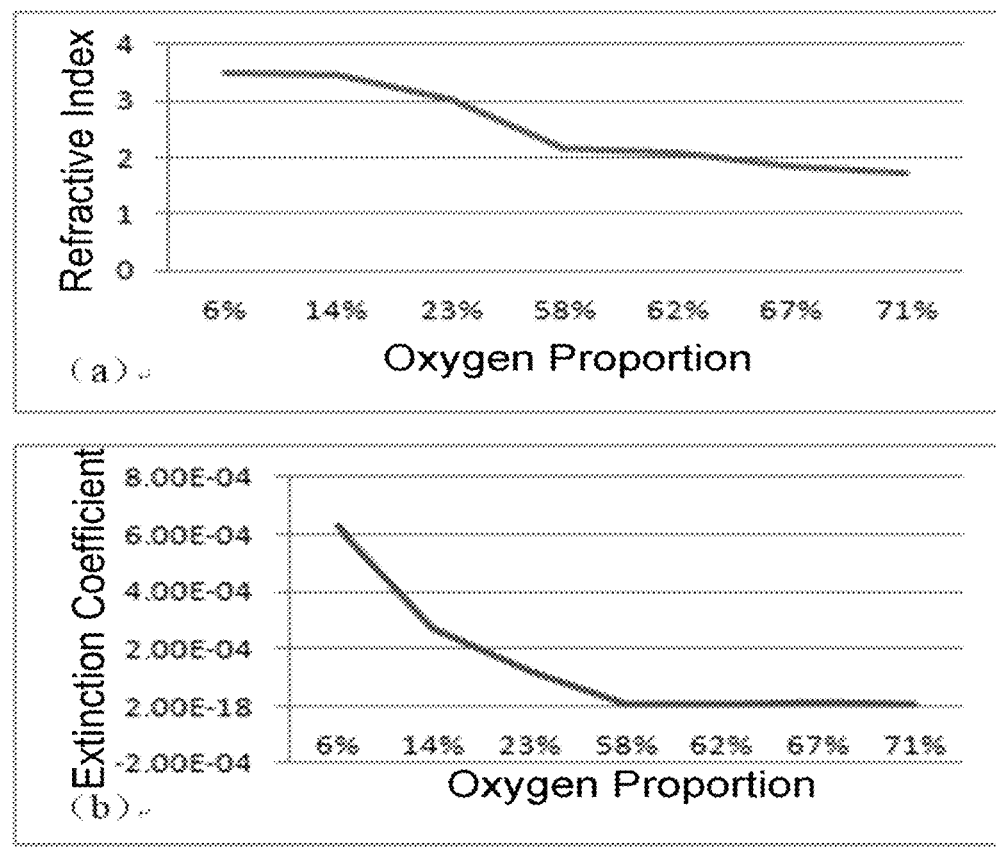
FIG. 3 shows influence of a proportion of oxygen in a hydrogen-oxygen mixed gas on a refractive index and an extinction coefficient of an oxygen-containing hydrogenated silicon film under 940 nm ((a) shows influence of the proportion of oxygen in the hydrogen-oxygen mixed gas on the refractive index of the oxygen-containing hydrogenated silicon film under 940 nm, and (b) shows influence of the proportion of oxygen in the hydrogen-oxygen mixed gas on the extinction coefficient of the oxygen-containing hydrogenated silicon film under 940 nm)

FIG. 3 shows influence of a proportion of oxygen in the hydrogen-oxygen mixed gas on the refractive index and the extinction coefficient of the oxygen-containing hydrogenated silicon film under 940 nm.

As shown in FIG. 3, the proportion of oxygen in the hydrogen-oxygen mixed gas influences the refractive index and the extinction coefficient of the oxygen-containing hydrogenated silicon film, and the refractive index and the extinction coefficient of the hydrogenated silicon film decrease gradually with increased proportion of the oxygen. When the oxygen proportion reaches the maximum 100%, i.e. the situation in Comparative Example 1, no hydrogen exists at this time, a film generated is a silicon dioxide film which has a relatively low refractive index.

The sputter source has a smaller power in Embodiment 10 than in Embodiment 1, the sputter source has a larger power in Embodiment 11 than in Embodiment 1, and the reaction source has a larger power in Embodiment 14 than in Embodiment 1, results show that better effects can be obtained through this system with the sputtering parameters in Embodiment 1.

Compared with Embodiment 1, restriction to the base body temperature and restriction to the annealing process are applied to Embodiments 15-17, which can facilitate improvements on the refractive index and stability.

Figure 4:
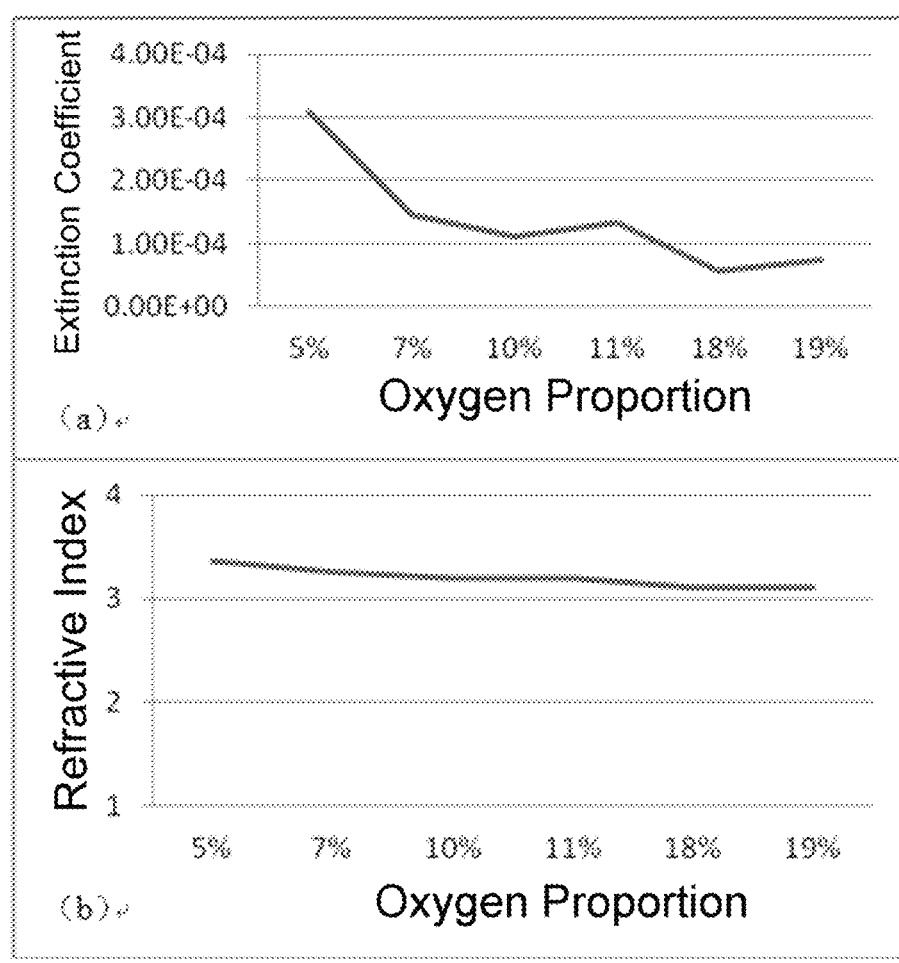
FIG. 4 shows influence of the proportion of oxygen in the hydrogen-oxygen mixed gas on the refractive index and the extinction coefficient of the oxygen-containing hydrogenated silicon film under 850 nm ((a) shows influence of the proportion of oxygen in the hydrogen-oxygen mixed gas on the refractive index of the oxygen-containing hydrogenated silicon film under 940 nm, and (b) shows influence of the proportion of oxygen in the hydrogen-oxygen mixed gas on the extinction coefficient of the oxygen-containing hydrogenated silicon film under 940 nm)

FIG. 4 shows influence of the proportion of oxygen in the hydrogen-oxygen mixed gas on the refractive index and the extinction coefficient of the oxygen-containing hydrogenated silicon film under 850 nm.

As shown in FIG. 4, influence of the proportion of oxygen in the hydrogen-oxygen mixed gas on the refractive index and the extinction coefficient of the oxygen-containing hydrogenated silicon film under 850 nm is similar to the result under 940 nm.

Embodiment 18

A preparation method for a high-refractive-index nitrogen-containing hydrogenated silicon film includes following steps:

(a) a clean substrate is placed on a drum, with a film coating face facing a target material;

(b) the drum rotates at a constant speed in a film coating chamber;

(c) when a vacuum degree is higher than $10^{-3}$Pa, a sputter source, which has a power of 8 KW, is started and argon is introduced therein, the argon is ionized to form plasmas, which bombard a high-purity silicon target under effects of an electricity and a magnetic field, and a silicon material is sputtered onto the substrate;

(d) the substrate is driven to a reaction source area with the rotation of the drum;

(e) the reaction source is started, wherein the reaction source has a power of 3 KW, hydrogen, nitrogen, and argon are introduced to the reaction source area, a gas flow rate is adjusted, such that the nitrogen introduced accounts for, in percentage by volume, 5% of a total amount of the hydrogen and nitrogen introduced, the gases are activated to form plasmas, which move at high speed towards the substrate under an effect of an electric field, and finally react with a silicon film on the substrate, forming the nitrogen-containing hydrogenated silicon film.

Embodiment 19

In a preparation method for a high-refractive-index nitrogen-containing hydrogenated silicon film, in Step (e), the nitrogen introduced accounts for, in percentage by volume, 8% of the total amount of the hydrogen and nitrogen introduced, and other steps and parameters are the same as those in Embodiment 15.

Embodiment 20

In a preparation method for a high-refractive-index nitrogen-containing hydrogenated silicon film, in Step (e), the nitrogen introduced accounts for, in percentage by volume, 12% of the total amount of the hydrogen and nitrogen introduced, and other steps and parameters are the same as those in Embodiment 15.

Embodiment 21

In a preparation method for a high-refractive-index nitrogen-containing hydrogenated silicon film, in Step (e), the nitrogen introduced accounts for, in percentage by volume, 20% of the total amount of the hydrogen and nitrogen introduced, and other steps and parameters are the same as those in Embodiment 15.

Embodiment 22

In a preparation method for a high-refractive-index nitrogen-containing hydrogenated silicon film, in Step (e), the reaction source has a power of 1.5 KW, and other steps and parameters are the same as those in Embodiment 15.

Embodiment 23

In a preparation method for a high-refractive-index nitrogen-containing hydrogenated silicon film, in Step (e), the reaction source has a power of 5 KW, and other steps and parameters are the same as those in Embodiment 15.

Embodiment 24

In a preparation method for a high-refractive-index nitrogen-containing hydrogenated silicon film, in Step (e), the reaction source has a power of 10 KW, and other steps and parameters are the same as those in Embodiment 15.

Embodiment 25

A preparation method for a high-refractive-index nitrogen-containing hydrogenated silicon film includes following steps:

(a) a clean substrate is placed on a drum, with a film coating face facing a target material;

(b) a turn plate rotates at a constant speed in a film coating chamber;

(c) when a vacuum degree is higher than $10^{-3}$Pa, a base body is heated to a base body temperature of 160° C., subsequently, argon is introduced to bombard and clean the film coating chamber and the base body, wherein the bombarding and cleaning lasts for 3 min, and a bombarding power is 2.3 KW; after the cleaning is completed, the argon is shut off, the film coating chamber is vacuumed again to a vacuum degree of $10^{-3}$Pa; a sputter source, which has a power of 8 KW, is started and argon is introduced therein, the argon is ionized to form plasmas, which bombard a high-purity silicon target under effects of an electricity and a magnetic field, and a silicon material is sputtered onto the substrate;

(d) the substrate is driven to a reaction source area with the rotation of the turn plate;

(e) the reaction source is started, wherein the reaction source has a power of 2 KW, hydrogen, nitrogen, and argon are introduced to the reaction source area, a gas flow rate is adjusted, such that the nitrogen introduced accounts for, in percentage by volume, 6% of a total amount of the hydrogen and nitrogen introduced, the hydrogen, the nitrogen, and the argon are well mixed in a gas mixing chamber and discharged, and the gases are activated to form plasmas, which move at high speed towards the substrate under an effect of an electric field, and finally react with a silicon film on the substrate, forming the nitrogen-containing hydrogenated silicon film;

(f) the nitrogen-containing hydrogenated silicon film is heated in an annealing furnace to 200° C. at a velocity of 10° C./min for 30 min; subsequently, the nitrogen-containing hydrogenated silicon film is kept at a constant temperature of 200° C. for 30 min; subsequently, the nitrogen-containing hydrogenated silicon film is cooled to an ambient temperature at a cooling velocity of 15° C./min, and taken out.

Embodiment 26

A preparation method for a high-refractive-index nitrogen-containing hydrogenated silicon film includes following steps:

(a) a clean substrate is placed on a drum, with a film coating face facing a target material;

(b) a turn plate rotates at a constant speed in a film coating chamber;

(c) when a vacuum degree is higher than $10^{-3}$Pa, a base body is heated to a base body temperature of 100° C., subsequently, argon is introduced to bombard and clean the film coating chamber and the base body, wherein the bombarding and cleaning lasts for 1 min, and a bombarding power is 0.6 KW; after the cleaning is completed, the argon is shut off, the film coating chamber is vacuumized again to a vacuum degree of $10^{-3}$Pa; a sputter source, which has a power of 8 KW, is started and argon is introduced therein, the argon is ionized to form plasmas, which bombard a high-purity silicon target under effects of an electricity and a magnetic field, and a silicon material is sputtered onto the substrate;

(d) the substrate is driven to a reaction source area with the rotation of the turn plate;

(e) the reaction source is started, wherein the reaction source has a power of 2 KW, hydrogen, nitrogen, and argon are introduced to the reaction source area, a gas flow rate is adjusted, such that the nitrogen introduced accounts for, in percentage by volume, 6% of a total amount of the hydrogen and nitrogen introduced, the hydrogen, the nitrogen, and the argon are well mixed in a gas mixing chamber and discharged, and the gases are activated to form plasmas, which move at high speed towards the substrate under an effect of an electric field, and finally react with a silicon film on the substrate, forming the nitrogen-containing hydrogenated silicon film;

(f) the nitrogen-containing hydrogenated silicon film is heated in an annealing furnace to 100° C. at a velocity of 2° C./min for 60 min; subsequently, the nitrogen-containing hydrogenated silicon film is kept at a constant temperature of 100° C. for 120 min; subsequently, the nitrogen-containing hydrogenated silicon film is cooled to an ambient temperature at a cooling velocity of 10° C./min, and taken out.

Embodiment 27

A preparation method for a high-refractive-index nitrogen-containing hydrogenated silicon film includes following steps:

(a) a clean substrate is placed on a drum, with a film coating face facing a target material;

(b) a turn plate rotates at a constant speed in a film coating chamber;

(c) when a vacuum degree is higher than $10^{-3}$Pa, a base body is heated to a base body temperature of 300° C., subsequently, argon is introduced to bombard and clean the film coating chamber and the base body, wherein the bombarding and cleaning lasts for 5 min, and a bombarding power is 4 KW; after the cleaning is completed, the argon is shut off, the film coating chamber is vacuumed again to a vacuum degree of $10^{-3}$Pa; a sputter source, which has a power of 8 KW, is started and argon is introduced therein, the argon is ionized to form plasmas, which bombard a high-purity silicon target under effects of an electricity and a magnetic field, and a silicon material is sputtered onto the substrate;

(d) the substrate is driven to a reaction source area with the rotation of the turn plate;

(e) the reaction source is started, wherein the reaction source has a power of 2 KW, hydrogen, nitrogen, and argon are introduced to the reaction source area, a gas flow rate is adjusted, such that the nitrogen introduced accounts for, in percentage by volume, 6% of a total amount of the hydrogen and nitrogen introduced, the hydrogen, the nitrogen, and the argon are well mixed in a gas mixing chamber and discharged, and the gases are activated to form plasmas, which move at high speed towards the substrate under an effect of an electric field, and finally react with a silicon film on the substrate, forming the nitrogen-containing hydrogenated silicon film;

(f) the nitrogen-containing hydrogenated silicon film is heated in an annealing furnace to 300° C. at a velocity of 15° C./min for 40 min; subsequently, the nitrogen-containing hydrogenated silicon film is kept at a constant temperature of 300° C. for 80 min; subsequently, the nitrogen-containing hydrogenated silicon film is cooled to an ambient temperature at a cooling velocity of 30° C./min, and taken out.

Comparative Example 2

In a preparation method for a high-refractive-index nitrogen-containing hydrogenated silicon film, in Step (e), the nitrogen introduced accounts for, in percentage by volume, 23% of the total amount of the hydrogen and nitrogen introduced, and other steps and parameters are the same as those in Embodiment 22.

Test Example 2

A refractive index and an extinction coefficient are measured for the nitrogen-containing hydrogenated silicon films obtained through the methods of Embodiments 15-21 and of Comparative Example 2, a specific measuring method is the same as that in Test Example 1.

Test results are listed in Table 2.

TABLE 2

| Embodiments or Comparative Examples | refractive index n | extinction coefficient k |
|---|---|---|
| Embodiment 18 | 3.220 | $5.12 \times 10^{-05}$ |
| Embodiment 19 | 3.194 | $6.21 \times 10^{-05}$ |
| Embodiment 20 | 3.117 | $7.95 \times 10^{-05}$ |
| Embodiment 21 | 2.995 | $9.14 \times 10^{-05}$ |
| Embodiment 22 | 3.206 | $5.58 \times 10^{-05}$ |
| Embodiment 23 | 3.186 | $4.96 \times 10^{-05}$ |
| Embodiment 24 | 3.048 | $2.21 \times 10^{-05}$ |
| Embodiment 25 | 3.292 | $4.55 \times 10^{-05}$ |
| Embodiment 26 | 3.214 | $5.36 \times 10^{-05}$ |
| Embodiment 27 | 3.317 | $5.09 \times 10^{-05}$ |
| Comparative Example 2 | 2.838 | $4.81 \times 10^{-06}$ |

It can be seen from Table 2 that the oxygen-containing hydrogenated silicon film obtained through the method of the present disclosure (the nitrogen accounting for 5~20% of a hydrogen-nitrogen mixed gas) has a refractive index of 3.0-3.3 under 940 nm, and a film with a high refractive index and low absorption can be obtained.

Figure 5:
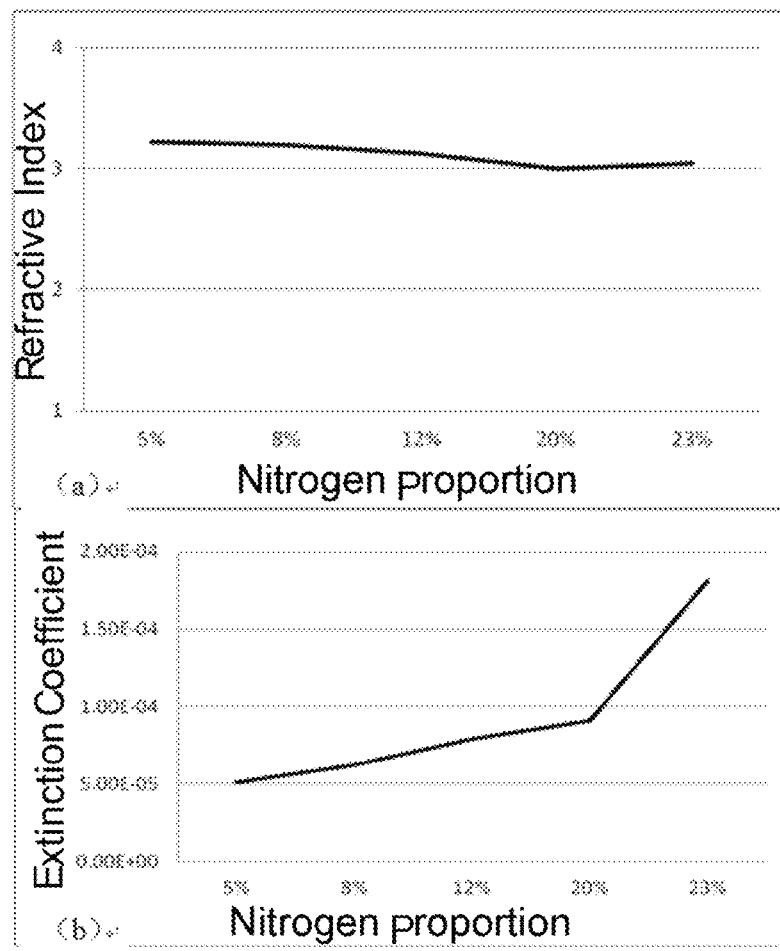
FIG. 5 shows influence of a proportion of nitrogen in a hydrogen-nitrogen mixed gas on a refractive index and an extinction coefficient of a nitrogen-containing hydrogenated silicon film under 940 nm ((a) shows influence of the proportion of nitrogen in the hydrogen-nitrogen mixed gas on the refractive index of the nitrogen-containing hydrogenated silicon film under 940 nm, and (b) shows influence of the proportion of nitrogen in the hydrogen-nitrogen mixed gas on the extinction coefficient of the nitrogen-containing hydrogenated silicon film under 940 nm)

FIG. 5 shows influence of the proportion of nitrogen in the hydrogen-nitrogen mixed gas on the refractive index and the extinction coefficient of the oxygen-containing hydrogenated silicon film under 940 nm.

As shown in FIG. 5, the proportion of nitrogen in the hydrogen-nitrogen mixed gas influences the refractive index and the extinction coefficient of the nitrogen-containing hydrogenated silicon film, and with increased proportion of the nitrogen, the refractive index of the hydrogenated silicon film decreases, while the extinction coefficient increases gradually, and when the nitrogen proportion is more than 20%, the extinction coefficient increases significantly.

Compared with Embodiment 18, the introduced nitrogen accounts for, in percentage by volume, 23% of the total amount of the hydrogen and nitrogen introduced in Comparative Example 2, and although the refractive index is relatively high, the extinction coefficient is also relatively high, thus requirements cannot be satisfied.

Comparing Embodiment 22 and Embodiment 23 with Embodiment, although the powers of the reaction source are different, the refractive indexes and the extinction coefficients are not much different, compared with Embodiment 18, the power of the reaction source is relatively large in Embodiment 24, and results show that better effects can be obtained through this sputtering system with the sputtering parameters in Embodiment 1.

Compared with Embodiment 18, restriction to the temperature of the base body and restriction to the annealing process are applied to Embodiment 25, which can facilitate improvement on stability.

Embodiment 28

A filter stack includes a plurality of the high-refractive-index oxygen-containing hydrogenated silicon films in Embodiment 3 and a plurality of $SiO_2$ films, which are stacked in alternation, wherein in Embodiment 3, each high-refractive-index hydrogenated silicon film has a thickness of 100 nm, each $SiO_2$ film has a thickness of 200 nm, and the filter stack has a thickness of 5 µm.

Embodiment 29

A filter stack includes a plurality of the high-refractive-index nitrogen-containing hydrogenated silicon films in Embodiment 17 and a plurality of the low-refractive-index oxygen-containing high-refractive-index hydrogenated silicon films (Embodiment 7), which are stacked in alternation, wherein each high-refractive-index nitrogen-containing hydrogenated silicon film has a thickness of 100 nm, each low-refractive-index oxygen-containing high-refractive-index hydrogenated silicon film has a thickness of 100 nm, and the filter stack has a thickness of 3 µm.

Test Example 3

Figure 6:
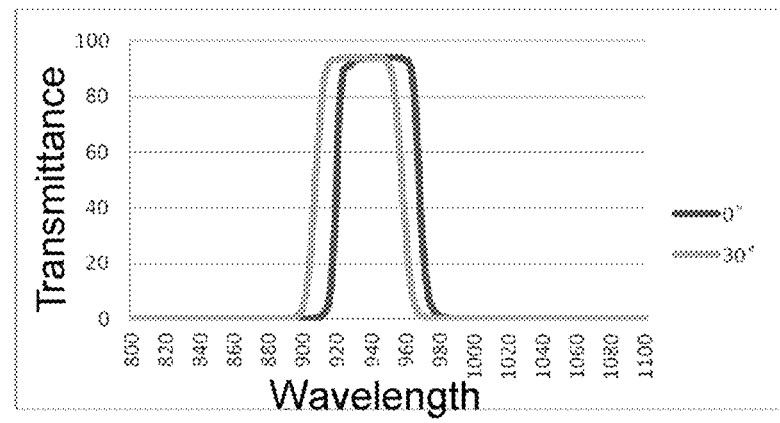
FIG. 6 shows a curve of actually measured spectrum of a bandpass filter, coated with a filter stack in Embodiment 28 with a center wavelength of 940 nm, at 0-30° incidence.

A curve of actually measured spectrum of a bandpass filter, coated with the filter stack in Embodiment 28 with a center wavelength of 940 nm, at 0-30° incidence, as shown in FIG. 6.

Figure 7:
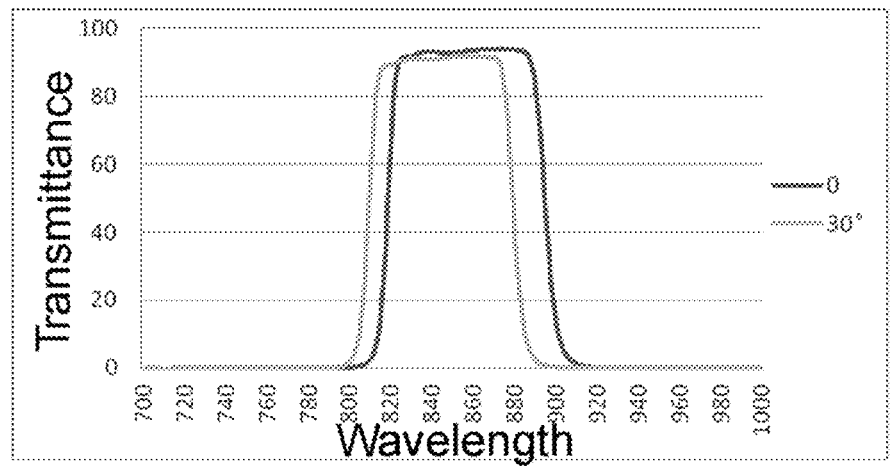
FIG. 7 shows a curve of actually measured spectrum of the bandpass filter, coated with the filter stack in Embodiment 28 with a center wavelength of 850 nm, at 0-30° incidence.

A curve of actually measured spectrum of a bandpass filter, coated with the filter stack in Embodiment 28 with a center wavelength of 850 nm, at 0-30° incidence, as shown in FIG. 7.

Figure 8:
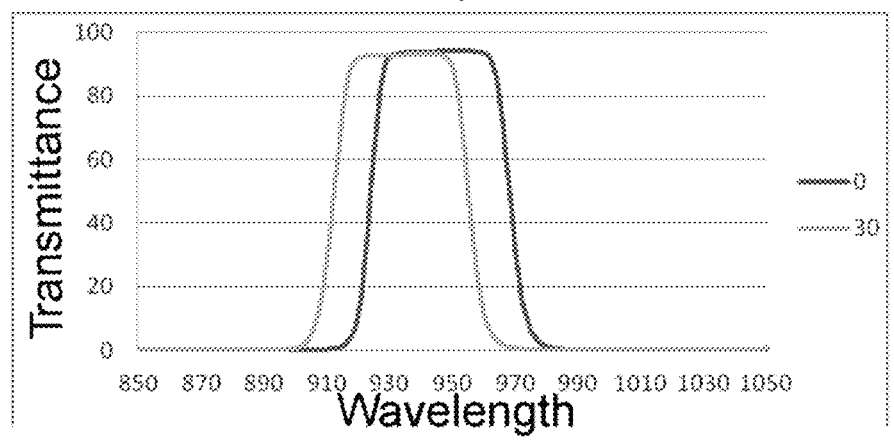
FIG. 8 shows a curve of actually measured spectrum of a bandpass filter, coated with a filter stack in Embodiment 29 with a center wavelength of 940 nm, at 0-30° incidence.

A curve of actually measured spectrum of a bandpass filter, coated with the filter stack in Embodiment 29 with a center wavelength of 940 nm, at 0-30° incidence, as shown in FIG. 8.

Figure 9:
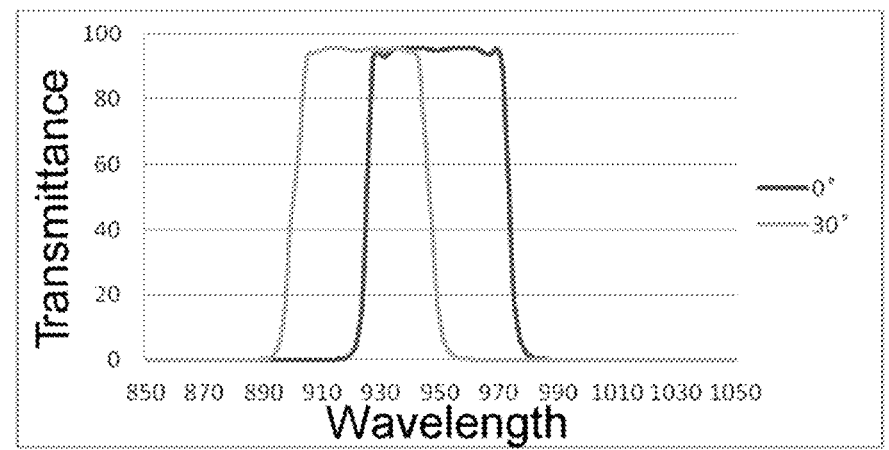
FIG. 9 shows a curve of actually measured spectrum of a bandpass filter, coated with a $TiO_2$ filter stack with a center wavelength of 940 nm, at 0-30° incidence.

A curve of actually measured spectrum of a bandpass filter, coated with a $TiO_2$ filter stack with a center wavelength of 940 nm, at 0-30° incidence, as shown in FIG. 9.

Results show that in FIG. 6, an offset is less than 14 nm, and a maximum transmittance is more than 94%, in FIG. 7, an offset is less than 11 nm, and a maximum transmittance is more than 94%. In FIG. 8, an offset is less than 12 nm, and a maximum transmittance is more than 94%.

For a bandpass filter of 940 nm designed using conventional $TiO_2$, $Ta_2O_5$, $Nb_2O_5$ and so on having a high refractive index, a center wavelength thereof has a relatively big angle-dependent offset (about 30 nm), and a big total film thickness (2-3 times the thickness of the present disclosure), meaning relatively low production efficiency. As shown in FIG. 9, it can be seen upon comparison that the filter coated with the material of the present disclosure has better spectral properties.

Although the present disclosure has been illustrated and described with embodiments, it should be realized that many other alterations and modifications may be made without departing from the spirit and scope of the present disclosure. Therefore, it means that the attached claims cover all these changes and modifications within the scope of the present disclosure.

INDUSTRIAL APPLICABILITY (1) The sputtering process and the reaction process in the preparation method for a high-refractive-index hydrogenated silicon film in the present disclosure are separate and independent from each other, then the target material is not likely to be polluted by the reactive gas in the sputtering process, effectively avoiding the poisoning problem of the target material. With this method, the production efficiency is improved, and the cost is reduced. The obtained oxygen-containing or nitrogen-containing hydrogenated silicon film has a relatively high refractive index and lower absorption.

(2) The hydrogenated silicon film obtained with the preparation method for a high-refractive-index hydrogenated silicon film in the present disclosure has a high refractive index and low absorption.

(3) The filter stack in the present disclosure is prepared by taking the oxygen-containing or nitrogen-containing hydrogenated silicon film as the high-refractive-index material, which has advantages of a high transmittance, a relatively small offset of the center wavelength, less signal loss, and a high signal to noise ratio.

(4) The filter in the present disclosure includes the above filter stack, and therefore has the same advantages as the above filter stack, such that the prepared filter has a relatively high transmittance and a small offset of the center wavelength.

What is claimed:

1. A preparation method for an oxygen-containing hydrogenated silicon film, comprising:
(a) placing a base body that is cleaned on a rotation mechanism of a vacuum sputtering reaction film coating machine, with a film coating face facing a sputter source, the rotation mechanism rotating at a constant speed in a film coating chamber; and
when a vacuum degree inside the film coating chamber is higher than $10^{-3}$ Pa, starting the sputter source to work at a power 0.75-12 KW and introducing argon to deposit Si on the base body by MF magnetron Si target sputtering from the sputter source, forming a silicon film;
(b) driving, along with the rotation of the rotation mechanism, the base body to a reaction source area; and starting the reaction source to work at a power of 0.5-8 KW and introducing and activating a mixture of hydrogen gas, oxygen gas, and an inert gas through RF or ICP to form plasmas consisting of hydrogen-oxygen-argon, and reacting the silicon film obtained from step (a) with the plasmas to form the oxygen-containing hydrogenated silicon film, wherein the inert gas is argon, and wherein an amount of active oxygen is 4-30% of a total amount of active hydrogen and the active oxygen by volume; and
(c) annealing the oxygen-containing hydrogenated silicon film obtained from step (b) in an annealing furnace at 100-300° C. for 60-180 minutes,
wherein the oxygen-containing hydrogenated silicon film has a refractive index of 1.46-3.7 and an extinction coefficient of less than 0.0001 over a wavelength range of 800-1100 nm after step (c).

2. The preparation method according to claim 1, wherein the amount of the active oxygen in step (b) accounts for 5-20% of the total amount of the active hydrogen and the active oxygen.

3. The preparation method according to claim 1, wherein the rotation mechanism is one selected from a turn plate, a drum, and a rotating stand.

4. The preparation method according to claim 1, wherein the film coating chamber is provided with a baffle configured to divide the film coating chamber into a first chamber, in which the sputter source is located, and a second chamber, in which the reaction source is located.

5. The preparation method according to claim 1, wherein
the film coating chamber is provided with a gas mixing chamber, hydrogen, oxygen, and argon are respectively introduced to the gas mixing chamber, and after being mixed well, the mixed gas is introduced to the film coating chamber to be activated; or,
the mixture of hydrogen gas, oxygen gas, and the inert gas is respectively introduced to the gas mixing chamber, and after being mixed well, the mixed gas is introduced to the film coating chamber to be activated.

6. The preparation method according to claim 1, further comprising:
heating the base body to a base body temperature of 100-300° C., and subsequently, introducing argon to bombard and clean the film coating chamber and the base body; and
shutting off the argon after the cleaning is completed, and vacuuming the film coating chamber again to a vacuum degree of higher than $10^{-3}$ Pa;
wherein, the bombarding and cleaning lasts for 1-5 minutes, and a bombarding power is 0.5 KW-8 KW, before starting the sputter source in step (a).

* * * * *